United States Patent
Mobarak et al.

(10) Patent No.: US 11,303,309 B1
(45) Date of Patent: Apr. 12, 2022

(54) BIAS ARRANGEMENTS WITH LINEARIZATION TRANSISTORS SENSING RF SIGNALS AND PROVIDING BIAS SIGNALS AT DIFFERENT TERMINALS

(71) Applicant: Analog Devices International Unlimited Company, Limerick (IE)

(72) Inventors: Mohamed Mobarak, Giza (EG); Mohamed Moussa Ramadan Esmael, American Project (EG); Mohamed Weheiba, Cairo (EG)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/065,084

(22) Filed: Oct. 7, 2020

(51) Int. Cl.
*H04L 27/08* (2006.01)
*H04B 1/04* (2006.01)

(52) U.S. Cl.
CPC ... *H04B 1/0458* (2013.01); *H04B 2001/0416* (2013.01); *H04B 2001/0425* (2013.01)

(58) Field of Classification Search
CPC .......... H04B 1/0458; H04B 2001/0416; H04B 2001/0425; H03G 1/00; H03F 3/20
USPC .................................................. 375/262, 345
See application file for complete search history.

(56) References Cited

U.S. PATENT DOCUMENTS

| | | |
|---|---|---|
| 5,923,215 A | 7/1999 | Hans |
| 6,043,714 A | 3/2000 | Yamamoto et al. |
| 6,130,579 A * | 10/2000 | Iyer ...................... H03F 1/0261 330/133 |
| 6,313,705 B1 | 11/2001 | Dening et al. |
| 6,803,822 B2 | 10/2004 | Kim et al. |
| 6,882,227 B2 | 4/2005 | Barry et al. |
| 6,922,107 B1 | 7/2005 | Green |
| 7,005,923 B2 | 2/2006 | Noh et al. |

(Continued)

FOREIGN PATENT DOCUMENTS

| | | |
|---|---|---|
| CN | 100488034 | 5/2009 |
| EP | 1429452 | 6/2004 |
| WO | WO 2004105231 | 12/2004 |

OTHER PUBLICATIONS

Zhang et al., Design of 900 MHz SiGe Power Amplifier with Linearization Bias Circuit, Progress in Electromagnetics Research C., vol. 64, 2016, 10 pages.
Noh et al., An Intelligent Power Amplifier MMIC Using a New Adaptive Bias Control Circuit for W-CDMA Applications, IEEE Journal of Solid-State Circuits, vol. 39, No. 6, Jun. 2004, 4 pages.
Vasjanov et al., A Review of Advanced CMOS RF Power Amplifier Architecture Trends for Low Power 5G Wireless Networks, MDPI electronics, Accepted Oct. 19, 2018; Published Oct. 23, 2018, 17 pages.

(Continued)

*Primary Examiner* — Don N Vo
(74) *Attorney, Agent, or Firm* — Patent Capital Group

(57) ABSTRACT

Bias arrangements for amplifiers are disclosed. An example arrangement includes a bias circuit, configured to produce a bias signal for the amplifier, and a linearization circuit, configured to improve linearity of the amplifier by modifying the bias signal based on an RF signal indicative of an RF input signal to be amplified by the amplifier. The linearization circuit includes a bias signal input for receiving the bias signal, an RF signal input for receiving the RF signal, and an output for providing a modified bias signal. The linearization circuit further includes at least a first linearization transistor, having a first terminal, a second terminal, and a third terminal, where each of the bias signal input and the RF signal input of the linearization circuit is coupled to the first terminal of the first linearization transistor, and the output of the linearization circuit is coupled to the third terminal of the first linearization transistor.

33 Claims, 9 Drawing Sheets

(56) References Cited

U.S. PATENT DOCUMENTS

| | | | |
|---|---|---|---|
| 7,253,681 | B2 | 8/2007 | Ichitsubo et al. |
| 7,710,204 | B2 | 5/2010 | Karoui et al. |
| 8,026,767 | B2 | 9/2011 | Chen et al. |
| 8,368,470 | B2 | 2/2013 | Alidio et al. |
| 8,624,678 | B2 | 1/2014 | Scott et al. |
| 9,035,697 | B2 | 5/2015 | Youssef et al. |
| 9,160,287 | B2 | 10/2015 | Briffa et al. |
| 9,467,101 | B2 | 10/2016 | Ni |
| 9,634,619 | B2 | 4/2017 | Gerard et al. |
| 9,813,029 | B2 | 11/2017 | Zhu et al. |
| 9,935,588 | B2 * | 4/2018 | Ni .............. H03F 3/19 |
| 2006/0244533 | A1 * | 11/2006 | Joly ............. H03F 1/0261 330/285 |
| 2007/0096823 | A1 | 5/2007 | Wang et al. |
| 2007/0252646 | A1 | 11/2007 | Leung et al. |
| 2007/0268074 | A1 * | 11/2007 | Vejzovic .......... H03F 1/301 330/296 |
| 2008/0074193 | A1 | 3/2008 | Wei et al. |
| 2008/0079495 | A1 | 4/2008 | Amano |
| 2009/0237156 | A1 | 9/2009 | Griffiths et al. |
| 2015/0105033 | A1 * | 4/2015 | Modi ............. H03F 3/19 455/78 |
| 2015/0180426 | A1 | 6/2015 | Kingsley |
| 2015/0268680 | A1 | 9/2015 | David et al. |
| 2015/0288338 | A1 | 10/2015 | Liu et al. |
| 2015/0349715 | A1 | 12/2015 | Gerard et al. |
| 2016/0320781 | A1 | 3/2016 | Signoff et al. |
| 2016/0164469 | A1 | 6/2016 | Nobbe et al. |
| 2016/0094189 | A1 | 11/2016 | Lyalin |
| 2017/0126179 | A1 | 5/2017 | Boyavalle et al. |
| 2018/0241347 | A1 | 8/2018 | Petrovic et al. |
| 2020/0028477 | A1 | 1/2020 | Moussa et al. |
| 2020/0195209 | A1 * | 6/2020 | Chen .............. H03F 3/195 |

OTHER PUBLICATIONS

Third Order Intercept Measurements, Agilent Technologies, Feb. 15, 2001, 7 pages.

Current Sense Resistors, OHMITE® www.ohmite.com, 2 pages.

Jones, P1dB and P3dB Definitions, Technical Note 002, Aug. 8, 2014, 2 pages.

Riordan, Discrete- and Integrated Control of Power Amplifiers in Base-Station Applications, Analog Dialouge 42-04, Apr. 2008, 4 pages.

Yang et al., A 5-GHz Band WLAN SiGe HBT Power Amplifier IC with Novel Adaptive-Linearizing CMOS Bias Circuit, IEICE Trans. Electron., vol. E98-C, No. 7, Jul. 2015, 8 pages.

Yen et al., A 0.25-μm 20-dBm 2.4-GHz CMOS Power Amplifier with an Integrated Diode Linearizer, IEEE Microwave and Wireless Components Letters vol. 13, No. 2, Feb. 2003.

He et al., 5.25 GHz Linear CMOS Power Amplifier with a Diode-Connected NMOS Bias Circuit, 2012.

English translation of CN101141114 of Description and Claims via Patent Translate).

Lie et al., *A Review of 5G Power Amplifier Design at cm-Wave and mm-Wave Frequencies*, Hindawi, Wireless Communications and Mobile Computing, vol. 2018, Article ID 96793814, 17 pages.

Non-Final Office Action issued in U.S. Appl. No. 16/779,221 dated Jun. 24, 2021, 9 pages.

Extended European Search Report issued in EP Application No. 21151446.8 dated Jun. 23, 2021, 10 pages.

Liu et al., *A K-Band Power Amplifier with Adaptive Bias in 90-nm CMOS*, Proceedings of the 9th European Microwave Integrated Circuits Conference, © 2014, 4 pages.

* cited by examiner

FIG. 3

BIAS ARRANGEMENTS WITH LINEARIZATION TRANSISTORS SENSING RF SIGNALS AND PROVIDING BIAS SIGNALS AT DIFFERENT TERMINALS

TECHNICAL FIELD OF THE DISCLOSURE

The present disclosure generally relates to radio frequency (RF) systems and, more particularly, to biasing and linearization techniques for amplifiers in RF systems.

BACKGROUND

Radio systems are systems that transmit and receive signals in the form of electromagnetic waves in the RF range of approximately 3 kilohertz (kHz) to 300 gigahertz (GHz). Radio systems are commonly used for wireless communications, with cellular/wireless mobile technology being a prominent example, but may also be used for cable communications such as cable television. In both of these types of systems, linearity of various components therein plays a crucial role.

Linearity of an RF component or a system is easy to understand in theory. Namely, linearity generally refers to the ability of a component or a system to provide an output signal that is directly proportional to an input signal. In other words, if a component or a system is perfectly linear, the relationship of a ratio of the output signal to the input signal is a straight line. Achieving this behavior in real-life components and systems is far more complicated and many challenges to linearity must be resolved, often at the expense of some other performance parameter, such as efficiency.

Made from semiconductor materials, which are inherently nonlinear, and having to operate at relatively high power levels, power amplifiers are usually the first components to analyze when considering a design of an RF system in terms of linearity. Power amplifier outputs with nonlinear distortions can result in reduced modulation accuracy (e.g., reduced error vector magnitude (EVM)) and/or out-of-band emissions. Therefore, both wireless communication systems (e.g., Long Term Evolution (LTE) and $5^{th}$ generation (5G) systems) and cable communication systems have stringent specifications on power amplifier linearity.

While linearity is also important for small-signal amplifiers such as low-noise amplifiers, the challenges of linearity are particularly pronounced for power amplifiers because such amplifiers are typically required to produce relatively high output-power levels and are, therefore, particularly susceptible to entering certain operating conditions where nonlinear behavior can no longer be ignored. On one hand, the nonlinear behavior of semiconductor materials used to form amplifiers tends to worsen when the amplifiers operate on signals with high power levels (an operating condition commonly referred to as "operating in saturation"), increasing the amount of nonlinear distortions in their output signals, which is highly undesirable. On the other hand, amplifiers operating in saturation also typically function at their highest efficiency, which is highly desirable.

As the foregoing illustrates, linearity and efficiency are two performance parameters for which oftentimes an acceptable trade-off has to be found in that improvements in terms of one of these parameters comes at the expense of the other parameter being less than optimal. To that end, the term "back-off" is used in the art to describe a measure of how far the input power (i.e., the power of a signal provided to the amplifier to be amplified) should be reduced in order to realize the desired output linearity (e.g., back-off may be measured as a ratio between the input power that delivers maximum power to the input power that delivers the desired linearity). Amplifiers, in particular power amplifiers, that are both linear and efficient (i.e., in which the back-off can be minimized or eliminated) are essential for modern communication systems. Therefore, further improvements with respect to the amplifier design and operation are always desirable.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIGS. 3-7 provide schematic illustrations of electric circuit diagrams of example implementations of the bias arrangements with linearization transistors sensing RF signals and providing bias signals at different terminals, according to various embodiments of the present disclosure;

DESCRIPTION OF EXAMPLE EMBODIMENTS OF THE DISCLOSURE

Overview

Figure 1:
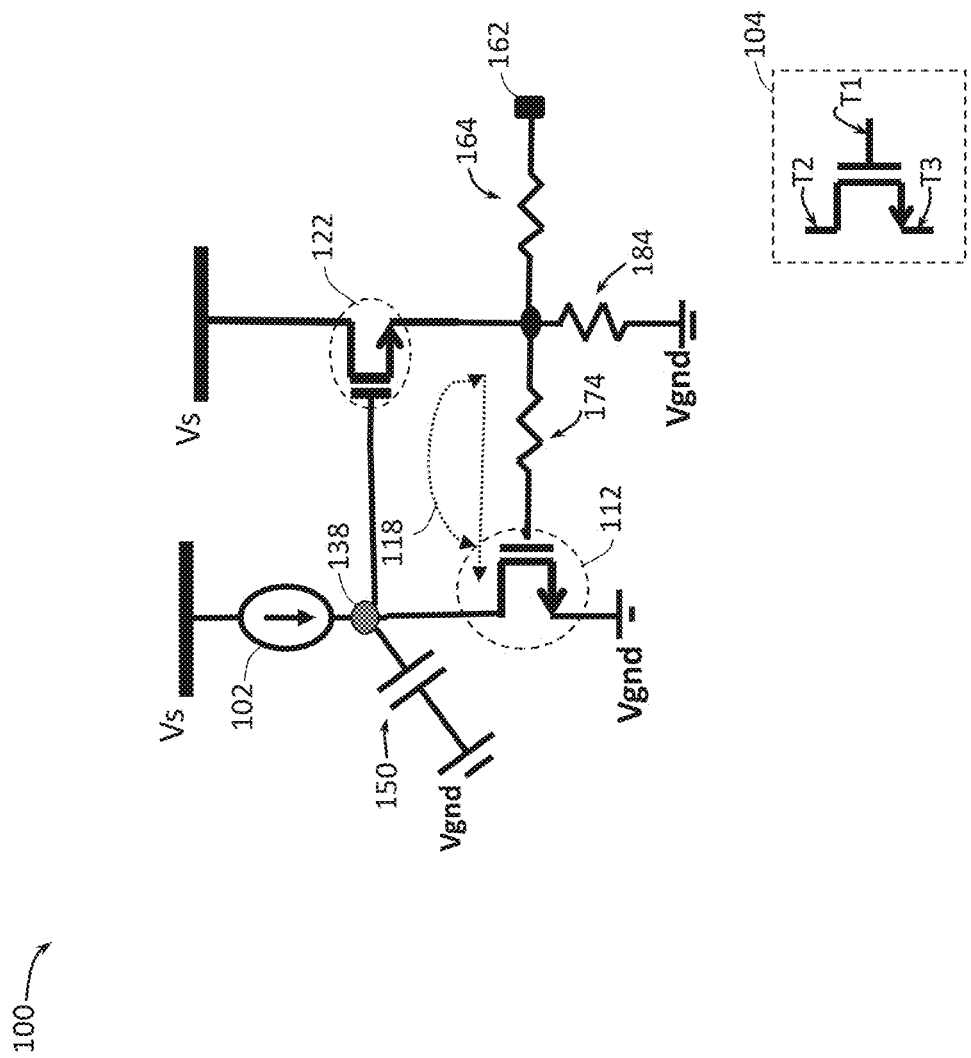
FIG. 1 provides a schematic illustration of an electric circuit diagram of a bias arrangement with a single loop for biasing and linearization, according to prior art.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating bias arrangements for amplifiers of wireless and cable communication systems, proposed herein, it might be useful to first understand phenomena that may come into play in such systems. The following foundational information may be viewed as a basis from which the present disclosure may be properly explained. Such information is offered for purposes of explanation only and, accordingly, should not be construed in any way to limit the broad scope of the present disclosure and its potential applications. While some of the following descriptions may be provided for the example of an amplifier being a power amplifier, embodiments of the present disclosure are equally applicable to other types of amplifiers such as low-noise amplifiers, variable gain amplifiers, etc.

In context of wireless radio systems, an antenna is a device that serves as an interface between radio waves propagating wirelessly through space and electric currents moving in metal conductors used with a transmitter or a receiver. During transmission, a radio transmitter may supply an electric signal, which signal is amplified by a power amplifier, and an amplified version of the signal is provided to antenna's terminals. The antenna may then radiate the energy from the signal output by the power amplifier as radio waves. Similarly, in cable radio systems, an electric signal is first amplified by a power amplifier, prior to transmission over a wired cable connection. Therefore, linear and efficient power amplifiers are essential both for wireless and for cable communication systems.

One approach to improving linearity of power amplifiers includes carefully controlling the bias signals provided thereto. For example, adaptive bias circuits have been developed to optimize linearity of power amplifiers. Such circuits are "adaptive" in that a bias signal provided to a power amplifier is made dependent on a signal that is to be amplified by a power amplifier, which may be advantageous in terms of improving linearity of the power amplifier. In another example, bias circuits have been developed which include one or more linearization transistors in addition to mirroring transistors. However, inventors of the present disclosure realized that conventional adaptive and linearization biasing techniques and circuits may still have drawbacks that may render them sub-optimal for the latest communication systems such as 5G systems. For example, conventional adaptive and linearization biasing techniques and circuits can be sensitive to process, voltage, and temperature (PVT) variations, may have a limited envelope bandwidth, and may not always be suitable for power amplifiers that utilize stacked transistors.

Various embodiments of the present disclosure provide systems and methods that aim to improve on one or more of the drawbacks described above in providing linear and efficient amplifiers (such as, but not limited to, power amplifiers, low-noise amplifiers, or variable gain amplifiers) for RF systems (such as, but not limited to, phased antenna arrays of 5G cellular technology or cable communication systems). In one aspect of the present disclosure, an example bias arrangement for an amplifier includes a bias circuit, configured to produce a bias signal for the amplifier, and a linearization circuit, configured to improve linearity of the amplifier by modifying the bias signal based on an RF signal indicative of an RF input signal to be amplified by the amplifier. The linearization circuit includes a bias signal input for receiving the bias signal (e.g., a DC signal), at least one RF signal input for receiving/sensing the RF signal (one RF signal input for sensing single-ended RF input signals and two RF signal inputs for sensing differential RF input signals), and an output for providing a modified bias signal. The linearization circuit further includes one or more linearization transistors, each having a first terminal, a second terminal, and a third terminal, where each of the bias signal input and the RF signal input of the linearization circuit is coupled to the first terminal of a first linearization transistor of the one or more linearization transistors, and where the output of the linearization circuit is coupled to the third terminal of the first linearization transistor. As the foregoing example illustrates, the RF signal is sensed at the first terminal of the first linearization transistor, while the modified bias signal is output at the third terminal of the first linearization transistor, thus the first linearization transistor is configured to sense RF signals and output modified bias signals at different terminals. Therefore, such a bias arrangement is referred to herein as a "bias arrangement with a linearization transistor sensing RF signals and providing bias signals at different terminals."

In another aspect of the present disclosure, in particular when the RF input signal is a differential signal, the linearization circuit of another example bias arrangement may further include a second linearization transistor, where the RF signal that is provided to the first terminal of the first linearization transistor may also be provided to the third terminal of the second linearization transistor. The third terminal of the second linearization transistor may then be coupled, e.g., via a resistor, to a node at which the second linearization transistors provides the modified bias signal (e.g., as is shown with the embodiment of FIG. 7). However, in such a bias arrangement the first linearization transistor is still configured so that it senses RF signals and provides bias signals at different terminals, and therefore, such a bias arrangement may still be referred to as a "bias arrangement with a linearization transistor sensing RF signals and providing bias signals at different terminals," irrespective of how the second linearization transistor is configured.

Providing bias arrangements with linearization transistors sensing RF signals and providing bias signals at different terminals may provide improvements over conventional bias arrangements in terms of, e.g., reduced sensitivity to PVT variations, increased envelope bandwidth, suitability for amplifiers that utilize stacked transistors, and decreased die area required to implement the arrangements.

The exact design of bias arrangements with linearization transistors sensing RF signals and providing bias signals at different terminals described herein may be realized in many different ways, all of which being within the scope of the present disclosure. In one example of design variations according to various embodiments of the present disclosure, a choice can be made, individually for each of the transistors of a bias arrangement with one or more linearization transistors sensing RF signals and providing bias signals at different terminals according to any of the embodiments described herein, to employ bipolar transistors (e.g., where various transistors may be NPN or PNP transistors), field-effect transistors (FETs), e.g., metal-oxide-semiconductor (MOS) technology transistors (e.g., where various transistors may be N-type MOS (NMOS) or P-type MOS (PMOS) transistors), or a combination of one or more FETs and one or more bipolar transistors. In view of that, in the following descriptions, transistors are sometimes described with reference to their first, second, and third terminals. The term "first terminal" (T1) of a transistor may be used to refer to a base terminal if the transistor is a bipolar transistor or to a gate terminal if the transistor is a FET, the term "second terminal" (T2) of a transistor may be used to refer to a collector terminal if the transistor is a bipolar transistor or to a drain terminal if the transistor is a FET, and the term "third terminal" (T3) of a transistor may be used to refer to an emitter terminal if the transistor is a bipolar transistor or to a source terminal if the transistor is a FET. These terms remain the same irrespective of whether a transistor of a given technology is an N-type transistor (e.g., an NPN transistor if the transistor is a bipolar transistor or an NMOS transistor if the transistor is a FET) or a P-type transistor (e.g., a PNP transistor if the transistor is a bipolar transistor or a PMOS transistor if the transistor is a FET). In another example, in various embodiments, a choice can be made, individually for each of the transistors of any of the bias arrangements with linearization transistors sensing RF signals and providing bias signals at different terminals as described herein, as to which transistors are implemented as N-type transistors (e.g., NMOS transistors for the transistors implemented as FETs, or NPN transistors for the transistors implemented as bipolar transistors) and which transistors are implemented as P-type transistors (e.g., PMOS transistors for the transistors implemented as FETs, or PNP transistors for the transistors implemented as bipolar transistors). In yet other examples, in various embodiments, a choice can be made as to what type of transistor architecture to employ. For example, any of the transistors of the bias arrangements with linearization transistors sensing RF input signals and providing bias signals at different terminals as described herein that are implemented as FETs may be planar transistors or may be non-planar transistors (some examples of the latter including FinFETs, nanowire transistors or nanoribbon transistors).

As will be appreciated by one skilled in the art, aspects of the present disclosure, in particular aspects of bias arrangements with linearization transistors sensing RF input signals and providing bias signals at different terminals, as described herein, may be embodied in various manners e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "arrangement," "module," or "system." At least some of the functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to various devices and systems (e.g. to various components and arrangements of components of RF systems, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings in which like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. If used, the terms "substantially," "approximately," "about," etc., may be used to generally refer to being within +/−20% of a target value, e.g., within +/−10% of a target value, based on the context of a particular value as described herein or as known in the art.

Prior Art Bias Arrangement with a Single Loop for Biasing and Linearization

FIG. 1 provides a schematic illustration of a bias arrangement 100 with a single loop for biasing and linearization, according to prior art. As shown in FIG. 1, a bias signal 102, e.g., a bias current, may be provided to a bias circuit transistor 112, which transistor is coupled in a loop 118 (shown in FIG. 1 with a dotted contour with arrows) with a linearization transistor 122. In FIG. 1 and the subsequent drawings, various transistors are shown within dashed oval/circular contours. An inset 104, shown in FIG. 1, illustrates an example transistor indicating what is referred to in the rest of the description as first, second, and third terminals, labeled as T1, T2, and T3, respectively, applicable to all of the present drawings. If a given transistor described herein is implemented as a FET, as is shown for both of the transistors of the bias arrangement 100, then, in accordance with the conventional nomenclature, the first terminal T1 is a gate terminal, the second terminal T2 is a drain terminal, and the third terminal T3 is a source terminal. The terminals T1-3T are not specifically labeled in the bias arrangement 100 or in the rest of the drawings in order to not clutter these drawings.

As shown in FIG. 1, the first terminal of the linearization transistor 122 may be coupled to the bias signal 102, e.g., via a node 138. The second terminal of the bias circuit transistor 112 may also be coupled to the node 138 and, therefore, to the linearization transistor 122. Furthermore, a capacitor 150 may be coupled between the node 138 and a ground potential (the ground potential labeled in FIG. 1 and subsequent drawings as "Vgnd"). The second terminals of the linearization transistor 122 may be coupled to a supply voltage (the supply voltage labeled in FIG. 1 and subsequent drawings as "Vs"), while the third terminals of the linearization transistor 122 may be coupled an output 162. FIG. 1 further illustrates a resistor 164 which may be coupled between the third terminal of the linearization transistor 122 and the output 162. FIG. 1 also illustrates a resistor 174, coupled between the first terminal of the bias circuit transistor 112 and the output 162, and a resistor 184, coupled between the third terminal of the linearization transistor 122 and the ground potential. In some implementations, the node 162 may be coupled to an RF input signal to be amplified by the amplifier, so that the linearization transistor 122 may sense said RF input signal in order to generate a modified bias signal.

Inventors of the present disclosure realized that the bias arrangement 100 has several drawbacks. The most significant drawback is that the bias circuit transistor 112 and the linearization transistor 122 share the same loop 118, which may limit linearization that may be realized by the linearization transistor 122, as well as limit mirroring accuracy that the bias circuit transistor 112 may achieve. In addition, sharing of the loop 118 in a manner shown in FIG. 1 may compromise stability of the loop 118. This, in turn, may result in a limited envelope bandwidth as linearizer loop bandwidth may be limited by its stability. In addition, inventors of the present disclosure realized that using a single bias circuit transistor 112 may make the design very sensitive for current mirroring in case stacked transistors are used in the amplifier.

Bias Arrangements with Separate Bias and Linearization Circuits Coupled by a Coupling Circuit Embodiments of the present disclosure are based on recognition that separating bias circuit transistors and linearization transistors so that they are not coupled in a single loop may provide improvements with respect to conventional bias arrangements such as the one shown in FIG. 1.

Figure 2:
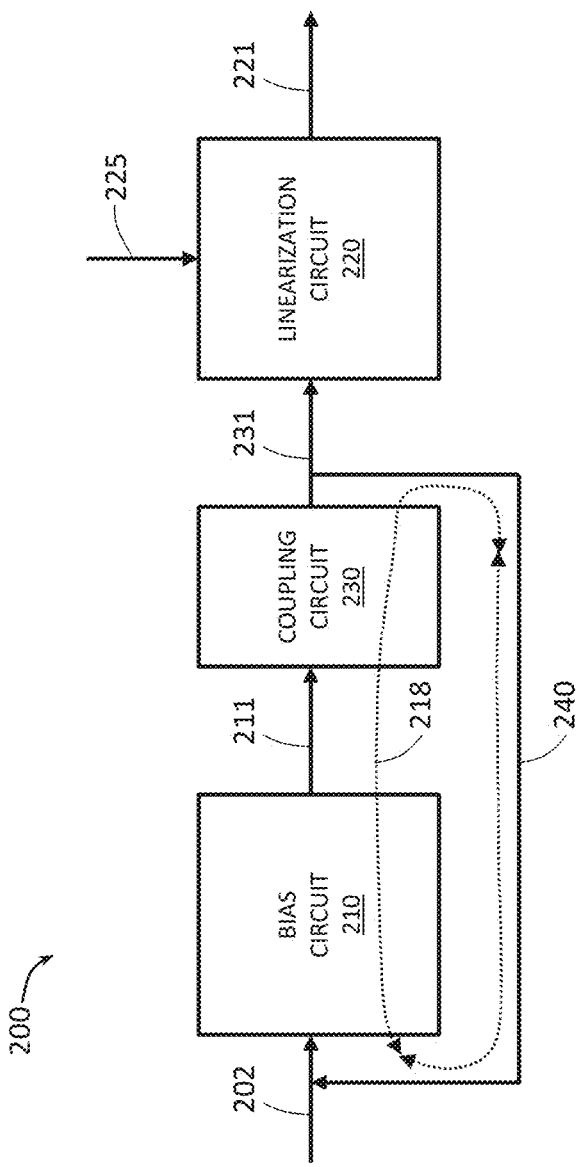
FIG. 2 provides a block diagram illustrating a bias arrangement with separate bias and linearization circuits coupled by a coupling circuit, according to various embodiments of the present disclosure.

FIG. 2 provides a block diagram illustrating a bias arrangement 200 with separate bias and linearization circuits 210, 220, coupled by a coupling circuit 230, according to some embodiments of the present disclosure. As shown in FIG. 2, the bias circuit 210 may be configured to receive an input signal 202 and generate an output signal 211. The input signal 202 may be a bias signal, e.g., a bias current, and the bias circuit 210 may be configured to mirror the input signal 202 to the output, i.e., the output signal 211 may be substantially a mirrored version of the bias signal 202 or a bias voltage. The coupling circuit 230 is configured to receive the output signal 211 from the bias circuit 210 as an input to the coupling circuit 230 and provide an output signal 231, which is based on the bias signal 211 output by the bias circuit 210. The linearization circuit 220 may be configured to receive the output signal 231 from the coupling circuit 230, and generate an output signal 221, which may then be provided to an amplifier (the amplifier not shown in FIG. 2). In particular, the linearization circuit 220 may be configured to improve linearity of the amplifier by modifying the bias signal 211 produced by the bias circuit 210 based on an RF signal 225 indicative of an RF input signal to be amplified by the amplifier to produce the output signal 221 which may be referred to as a "modified bias signal" 221 to be provided to the amplifier. In some embodiments, the RF signal 225 may be substantially the same as the RF input signal to be amplified by the amplifier, but in other embodiments the RF signal sensed by the linearization circuit 220 may be a somewhat different RF signal that is based on the RF input signal to be amplified by the amplifier.

As shown in FIG. 2, the coupling circuit 230 is configured to couple the bias circuit 210 and the linearization circuit 220. Providing the separate bias and linearization circuits 210, 220 coupled to one another by the coupling circuit 230 allows separating a linearization operation from a biasing loop, which may help overcome some drawbacks of prior art bias arrangement 100, provide improvements in terms of PVT variations, and achieve better linearization. In particular, a feedback path 240 may be provided, coupling the output of the coupling circuit 230 to the input of the bias circuit 202, thus forming a biasing loop 218.

In contrast to the biasing loop 118 shown in FIG. 1, the biasing loop 218 does not include the components of the linearization circuit 220. This may allow optimizing the components of the linearization circuit 220 without any bias or stability considerations/limitations, described above. Furthermore, the linearization circuit 220 may be designed without any closed loops, which may advantageously reduce or eliminate limiting envelope bandwidth of the bias arrangement 200.

It should be noted that, while FIG. 2 does not illustrate any additional components in the feedback path 240, in various embodiments, various active or passive components may be included therein. For example, in some embodiments, the feedback path 240 from the output of the coupling circuit 230 to the input of the bias circuit 202 may include a voltage level shifter, which may help provide a compliance voltage for the one or more transistors of the amplifier to which the modified bias signal 221 is provided. Thus, in various embodiments, one or more of voltage level shifters, transistors, resistors, capacitors, amplifiers, operational amplifiers (op-amps), etc., may be coupled between the output of the coupling circuit 230 and the input of the bias circuit 202 in the feedback path 240.

Sensing RF Input Signals and Outputting Bias Signals at Different Terminals

Embodiments of the present disclosure are further based on recognition that, in bias arrangements that separate bias circuit transistors and linearization transistors so that they are not coupled in a single loop (e.g., in bias arrangements as shown in FIG. 2), including one or more linearization transistors that are configured to sense RF signals indicative of the RF input to the amplifier and provide bias signals (i.e., output modified bias signals) at different terminals may provide further improvements with respect to conventional bias arrangements such as the one shown in FIG. 1. Some example implementations of the bias arrangement 200 in which one or more linearization transistors are configured to sense RF signals indicative of the RF input to the amplifier and provide bias signals (i.e., output modified bias signals) at different terminals are shown in FIGS. 3-7. However, any implementation of the bias arrangement 200 in line with the descriptions provided herein is within the scope of the present disclosure.

In FIGS. 3-7, reference numerals which were used in FIG. 2 are supposed to indicate elements of the bias arrangements which are the same or analogous to those shown in FIG. 2. For example, each of FIGS. 3-7 illustrates the bias circuit 210, the linearization circuit 220, and the coupling circuit 230, although the details of their specific implementation may be different in different ones of FIGS. 3-7.

Figure 3:
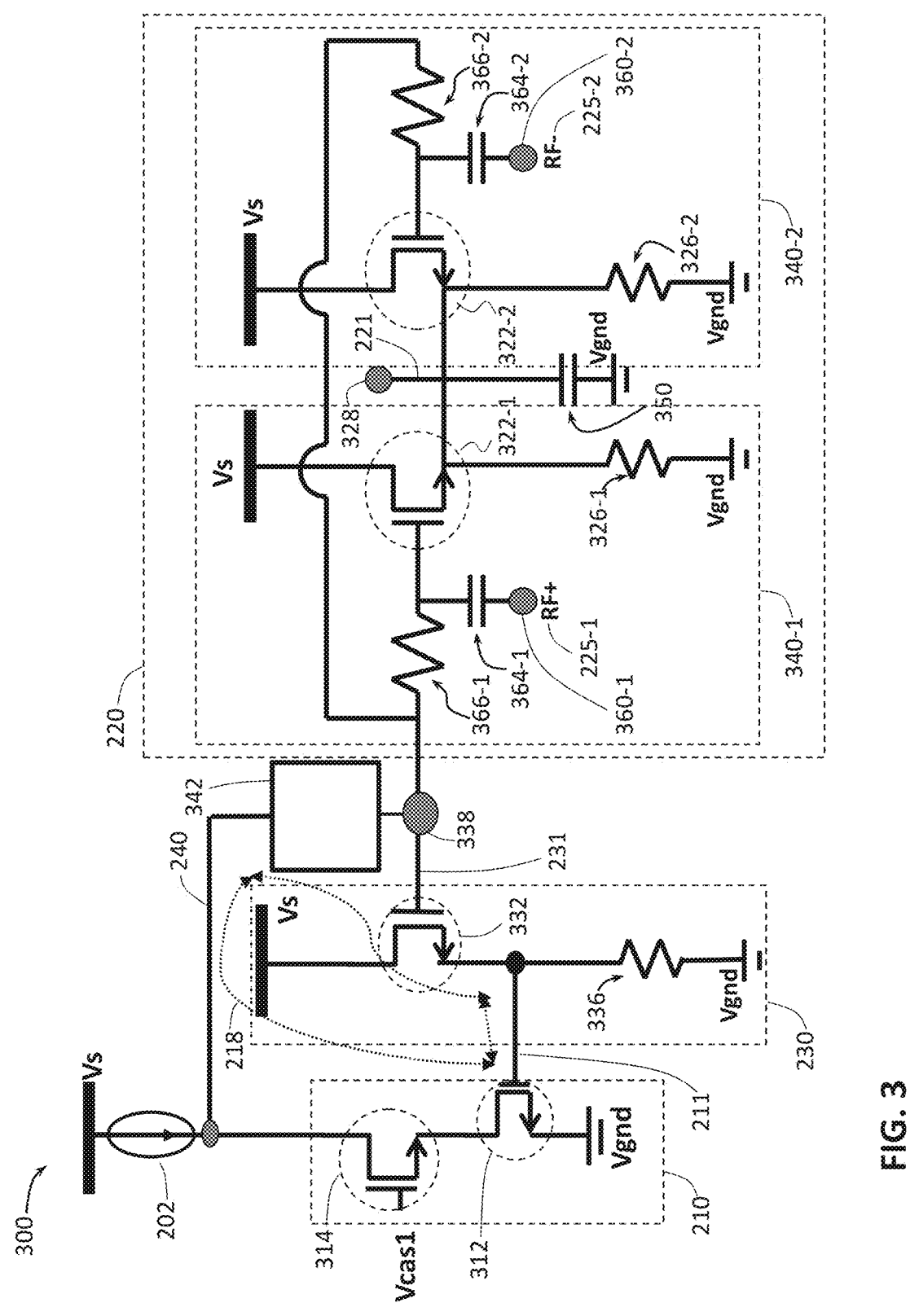

FIG. 3 provides a schematic illustration of an electric circuit diagram of a bias arrangement 300, which is the first example implementation of the bias arrangement 200, according to some embodiments of the present disclosure.

As shown in FIG. 3, in this example, the bias circuit 210 may include a first transistor 312 and a second transistor 314, which may be referred to as first and second "bias circuit transistors," arranged in a cascode arrangement. As known in the art, "cascode arrangement" of a first transistor and a second transistor means that the third terminal of the second transistor is coupled to the second terminal of the first transistor (continuing with the notation of the first, second, and third terminals as was explained with reference to FIG. 1). In this case, this means that the third terminal (e.g., the source terminal for the FET implementation of the transistor 314, shown in FIG. 3) of the second transistor 314 may be coupled to the second terminal (e.g., the drain terminal for the FET implementation of the transistor 312, shown in FIG. 3) of the first transistor 312. The first transistor 312 may be similar to the bias circuit transistor 112, shown in FIG. 1, in that it may be used to mirror the bias signal 202 to the output of the bias circuit, which is the first terminal of the first transistor 312 (e.g., the gate terminal for the FET implementation of the transistor 312, shown in FIG. 3). This is also indicated in FIG. 3 by illustrating that the output signal 211 is at the first terminal of the first transistor 312. The second transistor 314 may be omitted in some embodiments of the bias arrangement 300, in which case the second terminal of the transistor 312 would be coupled to the bias signal 202, and, eventually, to the supply voltage Vs (for the N-type transistor implementation shown in FIG. 3), e.g., to Vdd (for the FET implementation shown in FIG. 3). However, the embodiments where the second transistor 314 is used may be advantageous in that the bias circuit 210 having at least 2 transistors in a cascode arrangement may provide better mirroring accuracy in mirroring the bias signal 202 to the output of the bias circuit 210. When the second transistor 314 is used, its' second terminal may be coupled to the bias signal 202, and further to the supply voltage Vs (for the N-type transistor implementation shown in FIG. 3), e.g., to Vdd (for the FET implementation shown in FIG. 3), while the first terminal may be coupled to a reference voltage Vcas1, which may be a fixed DC voltage. In some embodiments, the reference voltage Vcas1 may be substantially the same voltage used to bias the cascode in the main power amplifier (the amplifier not shown in arrangement 200). Like the bias circuit transistor 112 shown in FIG. 1, the third terminal of the first transistor 312 may be coupled to the ground potential, Vgnd, for the N-type transistor implementation shown in FIG. 3.

As in FIG. 2, the output signal 211, provided at the first terminal of the transistor 312, may be provided from the bias circuit 210 to the coupling circuit 230. The example shown in FIG. 3 illustrates the coupling circuit 230 as a circuit that includes a transistor 332, which may be referred to as a "coupling transistor." The output 211 of the bias circuit 210 may be provided as an input to the coupling circuit 230 by being applied to the third terminal of the coupling transistor 332. For the N-type transistor implementation shown in FIG. 3, the third terminal of the coupling transistor 332 may further be coupled to the ground potential Vgnd, e.g., via a resistor 336, while the second terminal of the coupling transistor 332 may be coupled to the supply voltage Vs (e.g., Vdd for the FET implementation shown in FIG. 3). The first terminal of the coupling transistor 332 may be the terminal at which the output 231 of the coupling circuit 230 is provided. The output 231 of the coupling circuit 230 may then be coupled to the input of the bias circuit 210, thus forming the feedback path 240, as described with reference to FIG. 2. The example of FIG. 3 specifically illustrates a further component 342, which may be included in the feedback path 240 in some embodiments. The further component 342 may, e.g., be a voltage level shifter. In other embodiments, the feedback path 240 may not include any intermediate components and the first terminal of the coupling transistor 332 may be connected to the input of the bias circuit 210 directly. FIG. 3 illustrates a node 338, which can be seen as a node where the first terminals of the coupling transistor 332 and of the linearization transistors 322 are coupled together, and where each of these first terminals is coupled to the feedback path 240.

Turning to the linearization circuit 220, the linearization circuit 220 is configured to receive a bias signal at its' bias signal input. For example, the node 338 may be considered to be the bias signal input of the linearization circuit 220, at which the linearization circuit 220 may receive the output signal 231, indicative of the bias signal 211 generated by the bias circuit 210. The linearization circuit 220 may further include an RF signal input for receiving, or sensing, an RF signal (e.g., the RF signal 225, shown in FIG. 2) indicative of an RF input signal to be amplified by the amplifier. In particular, the embodiments of the linearization circuit 220 illustrated in FIG. 3 is an embodiment where the linearization circuit 220 is configured to sense a differential signal version of the RF input signal to be amplified by the amplifier. Thus, FIG. 3 illustrates the RF signal input of the linearization circuit 220 as including a first RF sensing node 360-1 and a second RF sensing node 360-2, which nodes may, therefore, be referred to as a first RF signal input and a second RF signal input, respectively. The first RF sensing node 360-1 may be coupled to a positive RF input signal RF+ and configured to receive a first RF signal 225-1, indicative of the positive variant of the differential RF input signal, i.e., RF+. The second RF sensing node 360-2 may be coupled to a negative RF input signal RF− and configured to receive a second RF signal 225-2, indicative of the negative variant of the differential RF input signal, i.e., RF−, where the positive and negative variants are complementary signals indicative of the RF input signal transmitted by means of differential signaling (i.e., the first RF signal 225-1 and the second RF signal 225-2 are complementary signals).

Because of the differential signal nature of sensing the RF input signal 225, in contrast to a single linearization transistor 122 shown in FIG. 1, the linearization circuit 220 includes two branches a first branch 340-1 may include a first linearization transistor 322-1 and a second branch 340-2 may include a second linearization transistor 322-2. Each of the linearization transistors 322 has one terminal at which the transistor can sense the RF signal 225, where the first linearization transistor 322-1 is configured to sense the RF signal 225-1 by having one of its terminals (e.g., the first terminal) being coupled to the first RF sensing node 360-1, while the second linearization transistor 322-2 is configured to sense the RF signal 225-2 by having one of its terminals (e.g., the first terminal) being coupled to the second RF sensing node 360-2. Furthermore, each of the linearization transistors 322 has another terminal (e.g., the third terminal) coupled to an output node 328, at which the modified bias signal 221 is provided. Thus, each of the linearization transistors 322 is configured to sense the RF signals and provide the bias signals at different terminals.

In some embodiments, the node 328 may also be coupled to a capacitor 350. For example, the first capacitor electrode of the capacitor 350 may be coupled to the ground potential (for the N-type transistor implementation of FIG. 3), while the second capacitor electrode of the capacitor 350 may be coupled to the node 328 and, thus, to the third terminal of each of the first and second linearization transistors 322. In some embodiments, the capacitor 350 may be used to filter at least some of the remaining RF signal and its harmonics and provide a filtered modified bias signal.

For each of the two linearization transistors 322, in addition to being coupled to the respective RF sensing node 360, the first terminal may be coupled to the first terminal of the coupling transistor 332, e.g., via the node 338, and may also be coupled to the bias signal 202, via the feedback path 240. Thus, for each of the two linearization transistors 322, the bias signal input of the linearization circuit 220 (e.g., the node 338) over which the linearization circuit 220 receives the input bias signal (e.g., the signal 231) is coupled to the first terminal of the linearization transistor 322. In some embodiments, for each of the two linearization transistors 322, the first terminal of a given linearization transistor 322 may be coupled to the node 338 via a bias signal coupling component 366, configured to couple the bias signal 231 to each of the linearization transistors 322. In some embodiments, the bias signal coupling component 366 may be implemented as a resistor, as illustrated in FIG. 3. Thus, in some embodiments, the bias signal input 338 of the linearization circuit 220 may be coupled to the first terminal of the first linearization transistor 322-1 by the bias signal input 338 being coupled the first terminal of the first bias signal coupling component 366-1, and by the second terminal of the first bias signal coupling component 366-1 being coupled to the first terminal of the first linearization transistor 322-1. Similarly for the second linearization transistor 322-2, in some embodiments, the bias signal input 338 of the linearization circuit 220 may be coupled to the first terminal of the second linearization transistor 322-2 by the bias signal input 338 being coupled the first terminal of the second bias signal coupling component 366-2, and by the second terminal of the second bias signal coupling component 366-2 being coupled to the first terminal of the second linearization transistor 322-2.

Similar coupling components may be included at the RF signal input of the linearization circuit 220 in some embodiments. As described above, for each of the two linearization transistors 322, a respective RF signal input of the linearization circuit 220 (e.g., the node 360-1 for the linearization transistor 322-1 or the node 360-2 for the linearization transistor 322-2) over which the linearization circuit 220 senses the RF input signal (e.g., the signal 225) may be coupled to the first terminal of the linearization transistor 322. In some embodiments, for each of the two linearization transistors 322, the first terminal of a given linearization transistor 322 may be coupled to the respective RF signal input 360 via an RF signal coupling component 364, configured to couple the respective RF signal 225-1 or 225-2 to the corresponding linearization transistor 322-1 or 322-2. In some embodiments, the RF signal coupling component 364 may be implemented as a capacitor, as illustrated in FIG. 3. Thus, in some embodiments, the first RF signal input represented by the first RF sensing node 360-1 of the linearization circuit 220 may be coupled to the first terminal of the first linearization transistor 322-1 by the first RF sensing node 360-1 being coupled the first terminal of the first RF signal coupling component 364-1 (e.g., the first capacitor electrode of the capacitor used to implement the first RF signal coupling component 364-1), and by the second terminal of the first RF signal coupling component 364-1 (e.g., the second capacitor electrode of the capacitor used to implement the first RF signal coupling component 364-1) being coupled to the first terminal of the first linearization transistor 322-1. Similarly for the second linearization transistor 322-2, in some embodiments, the second RF signal input represented by the second RF sensing node 360-2 of the linearization circuit 220 may be coupled to the first terminal of the second linearization transistor 322-2 by the second RF sensing node 360-2 being coupled the first terminal of the second RF signal coupling component 364-2 (e.g., the first capacitor electrode of the capacitor used to implement the second RF signal coupling component 364-2), and by the second terminal of the second RF signal coupling component 364-2 (e.g., the second capacitor electrode of the capacitor used to implement the second RF signal coupling component 364-2) being coupled to the first terminal of the second linearization transistor 322-2.

Furthermore, for each of the two linearization transistors 322, for the N-type transistor implementation shown in FIG. 3, the second terminal may be coupled to the supply voltage Vs, and the third terminal may further be coupled to the ground potential Vgnd. In some embodiments, the third terminals of the linearization transistors 322 may be coupled to Vgnd via a respective coupling component, e.g., via a resistor 326-1 for the linearization transistor 322-1 and via a resistor 326-2 for the linearization transistor 322-2. The resistors 326-1 and 326-2 may be configured to set the bias current of the linearization transistors 322. In some embodiments, one or more of the resistors 326-1, 326-2, and 336, shown in FIG. 3, may be replaced by respective current sources (not shown in the present drawings). In some embodiments, the coupling transistor 332 may be substantially a replica of one of the linearization transistors 322, e.g., the coupling transistor 332 may have substantially the same dimensions and be formed of substantially the same materials as one of the linearization transistors 322. In other embodiments, the coupling transistor 332 may have dimensions of any multiple of one of the linearization transistors 322.

Figure 4:
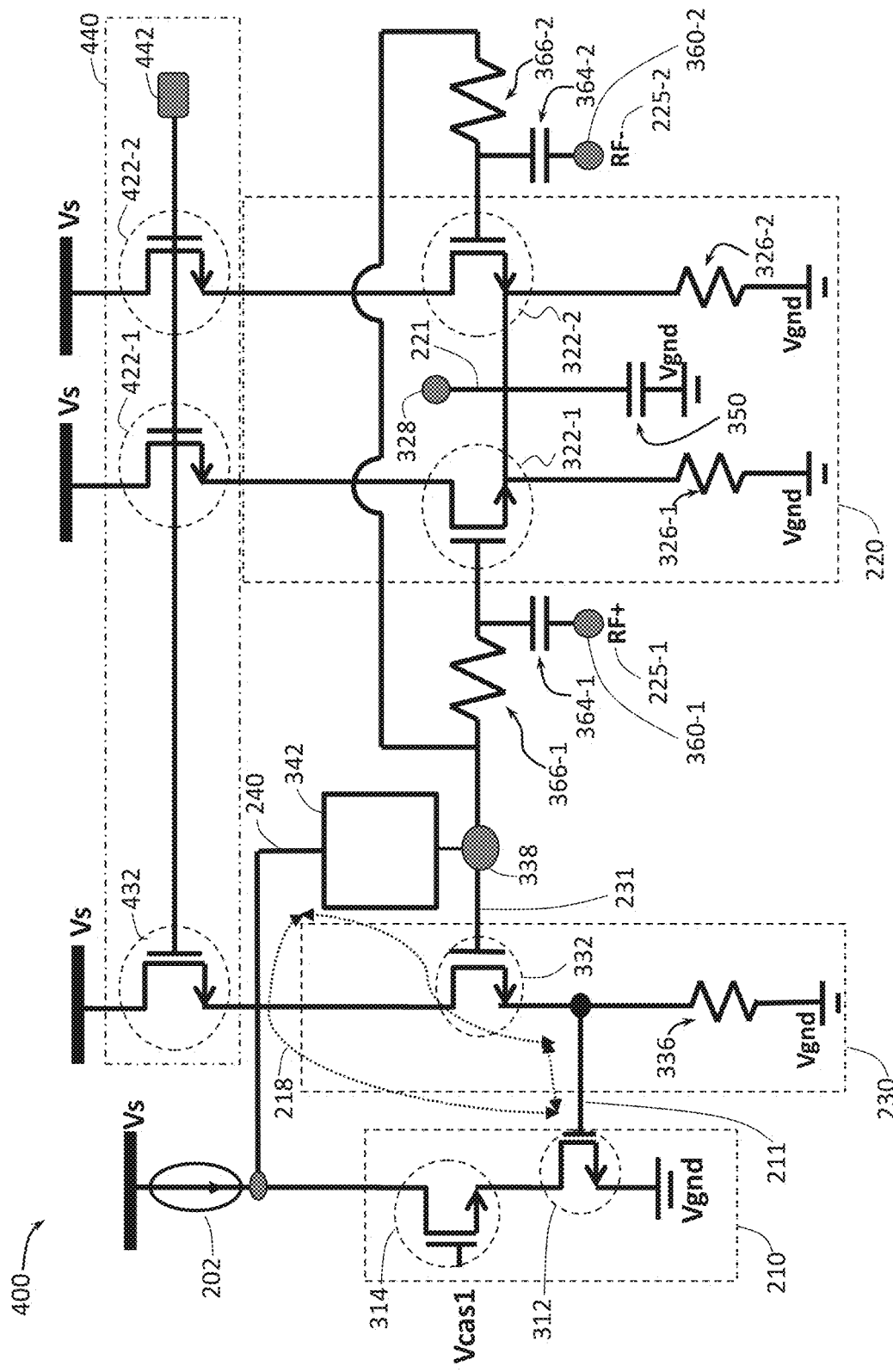

FIG. 4 provides a schematic illustration of an electric circuit diagram of a bias arrangement 400, which is the second example implementation of the bias arrangement 200, according to some embodiments of the present disclosure. The bias arrangement 400 includes portions that are substantially the same as the bias arrangement 300, except that it further illustrates additional components enclosed within a dash-dotted contour 440. Therefore, in the interests of brevity, descriptions of the elements shown in FIG. 4 which were already provided with reference to FIG. 3 are not repeated, and only the differences between these drawings are described. The bias arrangement 400 illustrates that, in some embodiments, cascode transistors may be added to one or both of the coupling circuit 230 and the linearization circuit 220. For example, in some embodiments, a second coupling transistor 432 may be coupled, in a cascode arrangement, to the coupling transistor 332. In this case, the second terminal of the coupling transistor 332 could be coupled to the supply voltage Vs via the second coupling transistor 432 by virtue of being coupled to the third terminal of the second coupling transistor 432 and the second terminal of the second coupling transistor 432 being then coupled to the supply voltage. Similarly, in some embodiments a second linearization transistor 422 (shown in FIG. 4 as a transistor 422-1 for the first branch 340-1 of the linearization circuit 220, and shown as a transistor 422-2 for the second branch 340-2 of the linearization circuit 220) may be coupled, in a cascode arrangement, to the respective linearization transistor 322. In this case, the second terminal of the linearization transistor 322-1 could be coupled to the supply voltage Vs via the second linearization transistor 422-1 by virtue of being coupled to the third terminal of the second linearization transistor 422-1 and the second terminal of the second linearization transistor 422-1 being then coupled to the supply voltage. Further, the second terminal of the linearization transistor 322-2 could be coupled to the supply voltage Vs via the second linearization transistor 422-2 by virtue of being coupled to the third terminal of the second linearization transistor 422-2 and the second terminal of the second linearization transistor 422-2 being then coupled to the supply voltage. The first terminals of each of the cascode transistors of the portion 440 may be coupled to a voltage source 442, which may provide a suitable voltage to, e.g., match the drain-source voltage (Vds) of the linearization transistors 322-1, 322-2 and/or of the transistors included in the amplifier to which the modified bias signal 221 is provided. Addition of the cascode transistors of the portion 440 shown in FIG. 4 may be particularly advantageous if the amplifier also includes such cascode transistors. Although FIG. 4 illustrates that cascode transistors are added to both of the coupling circuit 230 and the linearization circuit 220, in other embodiments of the bias arrangement 400, such cascode transistors may be added to one, but not both, of the coupling circuit 230 and the linearization circuit 220.

Figure 5:
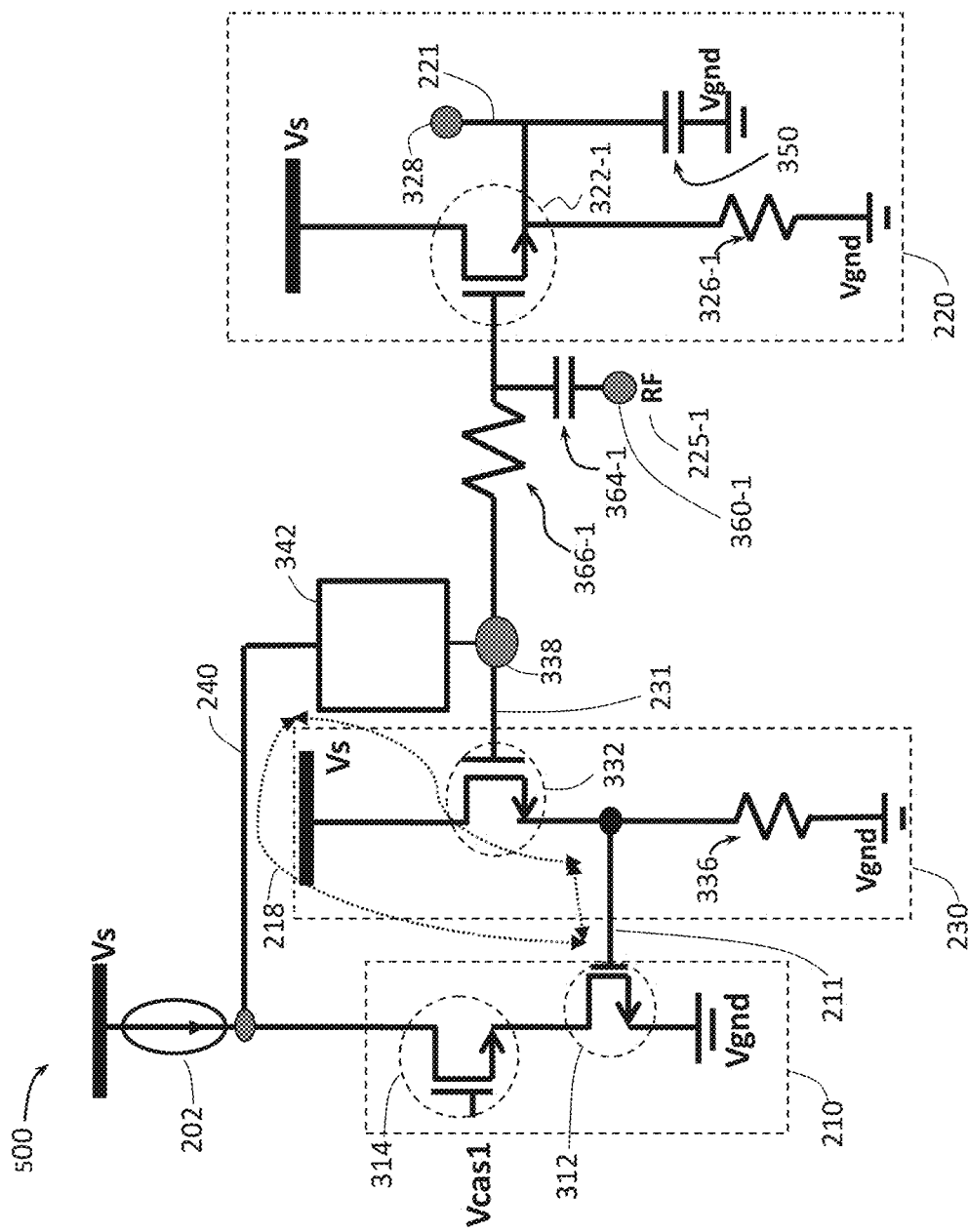

FIG. 5 provides a schematic illustration of an electric circuit diagram of a bias arrangement 500, which is the third example implementation of the bias arrangement 200, according to some embodiments of the present disclosure. The bias arrangement 500 includes portions that are substantially the same as the bias arrangement 300 and, therefore, in the interests of brevity, descriptions of the elements shown in FIG. 5 which were already provided with reference to FIG. 3 are not repeated, and only the differences between these drawings are described. FIG. 5 differs from FIG. 3 in that, instead of having the RF signal input of the linearization circuit 220 as a differential input as was shown in FIG. 3 (i.e., two branches 340-1 and 340-2 and two RF sensing nodes 360-1 and 360-2), the bias arrangement 500 has a single branch configured to sense the RF signal 225. Therefore, one of the two branches of the linearization circuit 220 that were shown in FIG. 3 is not present in FIG. 5 (e.g., the second branch 340-2 with the linearization transistor 322-2).

Figure 6:
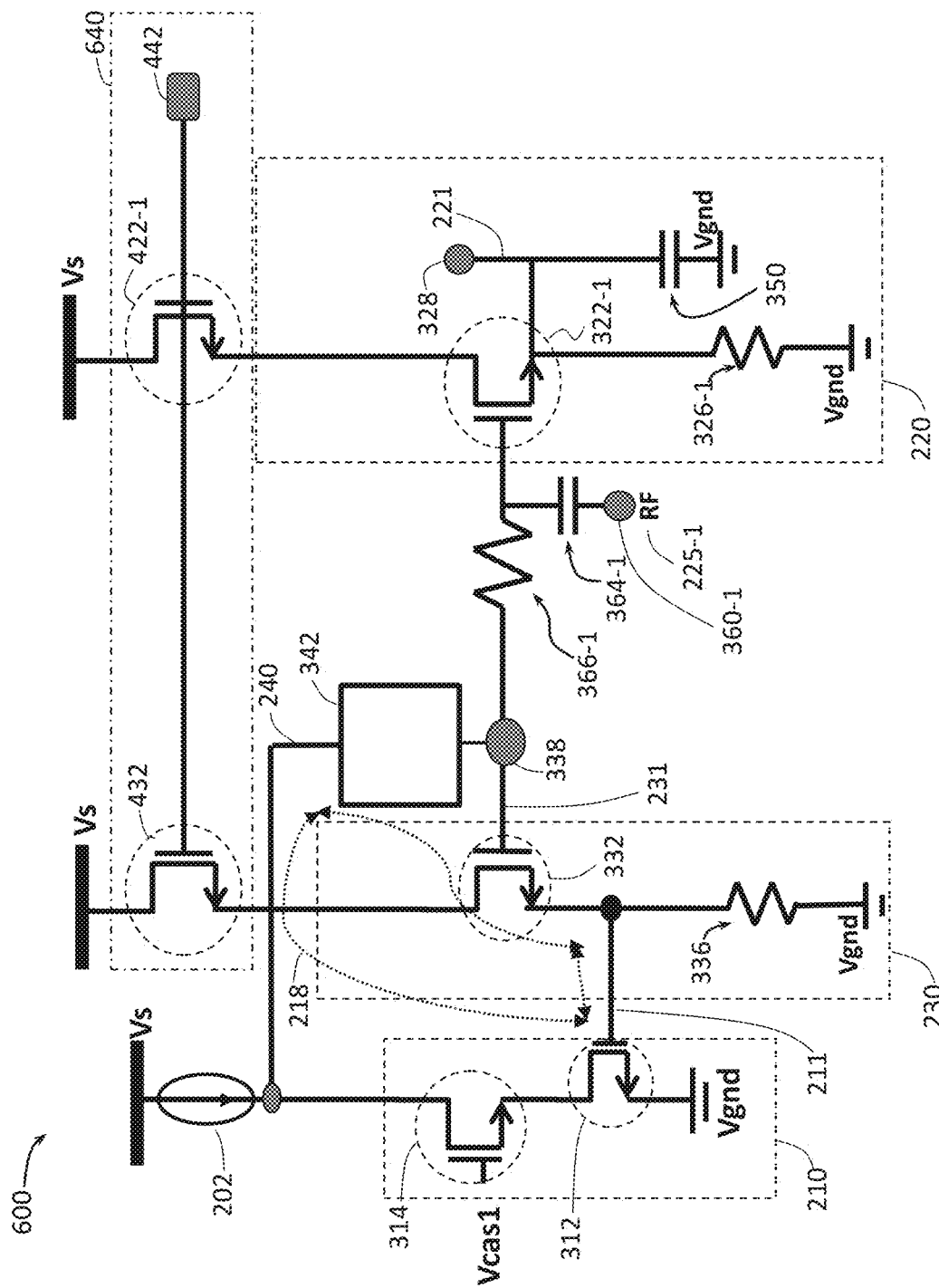

FIG. 6 provides a schematic illustration of an electric circuit diagram of a bias arrangement 600, which is the fourth example implementation of the bias arrangement 200, according to some embodiments of the present disclosure. The bias arrangement 600 includes portions that are substantially the same as the bias arrangement 500, except that it further illustrates additional components enclosed within a dash-dotted contour 640. Therefore, in the interests of brevity, descriptions of the elements shown in FIG. 6 which were already provided with reference to FIG. 5 are not repeated, and only the differences between these drawings are described. Similar to the bias arrangement 400, the bias arrangement 600 illustrates that, in some embodiments, cascode transistors may be added to one or both of the coupling circuit 230 and the linearization circuit 220. Such cascode transistors may be as those described with reference to FIG. 4, therefore, the same reference numerals are used in FIG. 6 as the ones used in FIG. 4. For example, in some embodiments, the second coupling transistor 432 may be coupled, in a cascode arrangement, to the coupling transistor 332, as described above. Similarly, in some embodiments, the second linearization transistor 422-1 may be coupled, in a cascode arrangement, to the linearization transistor 322-1, also as described above. Addition of the cascode transistors of the portion 640 shown in FIG. 6 may be particularly advantageous if the amplifier also includes such cascode transistors.

Figure 7:
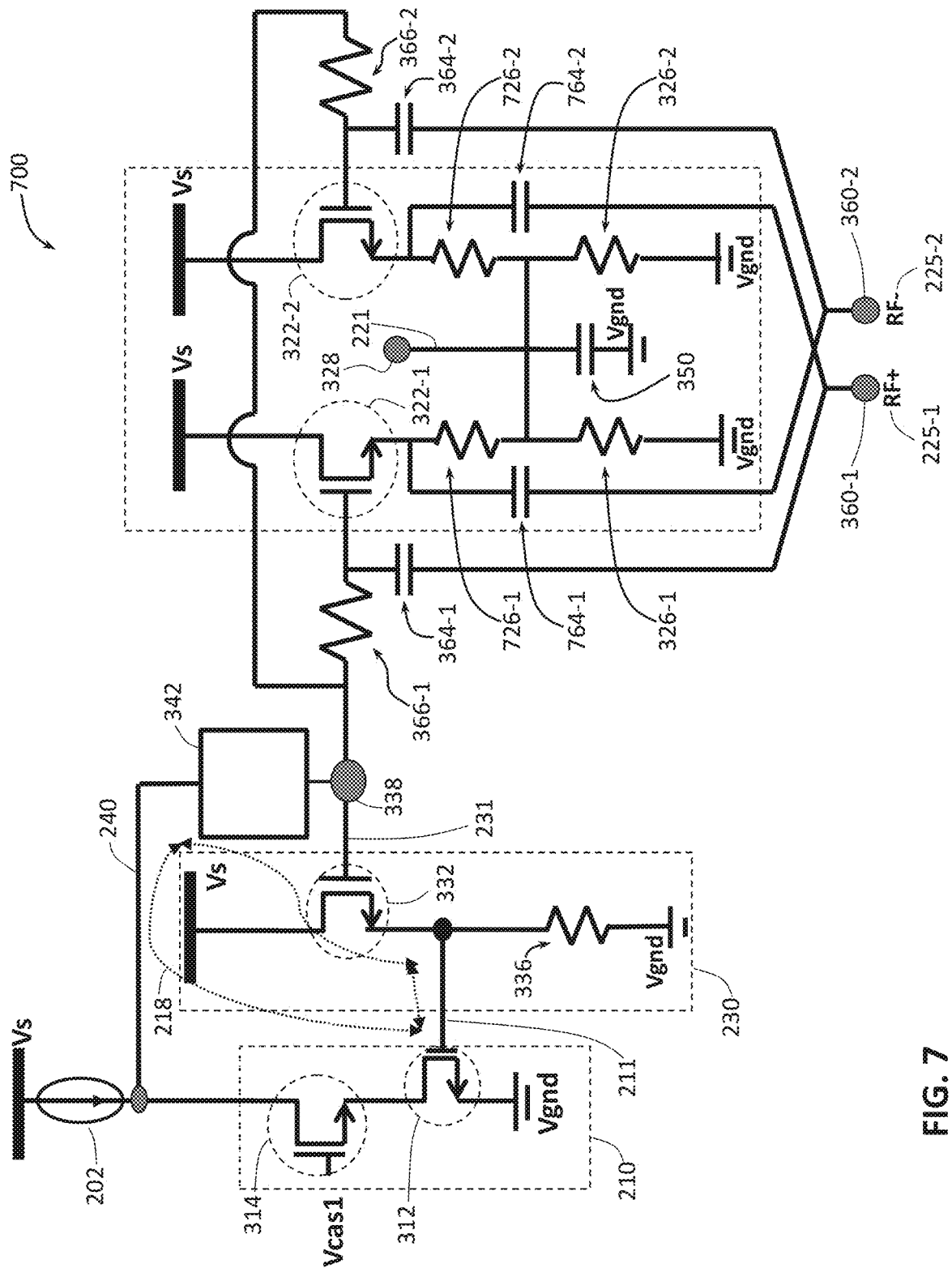

FIG. 7 provides a schematic illustration of an electric circuit diagram of a bias arrangement 700, which is the fifth example implementation of the bias arrangement 200, according to some embodiments of the present disclosure. The bias arrangement 700 includes portions that are substantially the same as the bias arrangement 300, except that it further illustrates cross-coupling of the RF input signals 225-1 and 225-2 to the opposite branches 340. Therefore, in the interests of brevity, descriptions of the elements shown in FIG. 7 which were already provided with reference to FIG. 3 are not repeated, and only the differences between these drawings are described. The bias arrangement 700 illustrates that, in some embodiments of a bias arrangement configured to sense a differential RF input signal, each of the RF sensing nodes 360 may be coupled not only to the first terminal of the linearization transistor of one branch (i.e., either 340-1 or 340-2), but also to the third terminal of the linearization in the other branch (i.e., either 340-2 or 340-1, respectively). For example, as shown in FIG. 7, the first RF sensing node 360-1 may be coupled not only to the first terminal of the first linearization transistor 322-1, included in the first branch 340-1, but also to the third terminal of the second linearization transistor 322-2, included in the second branch 340-2. Similarly, the second RF sensing node 360-2 may be coupled not only to the first terminal of the second linearization transistor 322-2, included in the second branch 340-2, but also to the third terminal of the first linearization transistor 322-1, included in the first branch 340-1. Such cross-coupling may advantageously increase the RF linearization range.

In some embodiments, for each of the two linearization transistors 322, the third terminal of a given linearization transistor 322 of one branch may be coupled to the RF sensing node 360 coupled to the first terminal of the linearization transistor 322 of the other branch via a further RF signal coupling component 764, configured to couple the RF signal 225-1 or 225-2 to, respectively, the linearization transistor 322-2 or 322-1. In some embodiments, the further RF signal coupling component 764 may be implemented as a capacitor, as illustrated in FIG. 7. Thus, in some embodiments, the first RF sensing node 360-1 may be coupled to the third terminal of the second linearization transistor 322-2 by the first RF sensing node 360-1 being coupled the first terminal of the second further RF signal coupling component 764-2 (e.g., the first capacitor electrode of the capacitor used to implement the first further RF signal coupling component 764-2), and by the second terminal of the second further RF signal coupling component 764-2 (e.g., the second capacitor electrode of the capacitor used to implement the second RF signal coupling component 764-2) being coupled to the third terminal of the second linearization transistor 322-2. Similarly for the second linearization transistor 322-2, in some embodiments, the second RF sensing node 360-2 may be coupled to the third terminal of the first linearization transistor 322-1 by the second RF sensing node 360-2 being coupled the first terminal of the first further RF signal coupling component 764-1 (e.g., the first capacitor electrode of the capacitor used to implement the first further RF signal coupling component 764-1), and by the second terminal of the first further RF signal coupling component 764-1 (e.g., the second capacitor electrode of the capacitor used to implement the first further RF signal coupling component 764-1) being coupled to the third terminal of the first linearization transistor 322-1. Implementing the further RF signal coupling components 764 may advantageously allow rejecting or reducing unwanted signals such as common mode signals and harmonics.

FIG. 7 further illustrates that, in some embodiments, the bias arrangement 700 may further include degeneration components 726. In some embodiments, the degeneration components 726 may be implemented as resistors, as illustrated in FIG. 7. In some embodiments, the output node 328 of the linearization circuit 220 may be coupled to the third terminal of the first linearization transistor 322-1 by the first terminal of the first degeneration component 726-1 being coupled to the output node 328, and the second terminal of the first degeneration component 726-1 being coupled to the third terminal of the first linearization transistor 322-1. Similarly, in some embodiments, the output node 328 may further be coupled to the third terminal of the second linearization transistor 322-2 by the first terminal of the second degeneration component 726-2 being coupled to the output node 328, and the second terminal of the second degeneration component 726-2 being coupled to the third terminal of the second linearization transistor 322-2. Furthermore, in some embodiments, the second RF sensing node 360-2 may further coupled to the third terminal of the first linearization transistor 322-1 by the second RF sensing node 360-2 being coupled to the second terminal of the first degeneration component 726-1, and the first RF sensing node 360-1 may further be coupled to the third terminal of the second linearization transistor 322-2 by the first RF sensing node 360-1 being coupled to the second terminal of the second degeneration component. Implementing the degeneration resistors 726 may advantageously allow improving transistor characteristics of the linearization circuit 220.

Although not specifically shown in the present drawings, in some embodiments, the degeneration resistors 726 may be included in the bias arrangements described with reference to FIGS. 3-6. Furthermore, although also not specifically shown in the present drawings, in some embodiments, the bias arrangement 700 may be further modified to include the cascode transistors as were described with reference to FIG. 7 (e.g., transistors enclosed within a dash-dotted contour 440 in FIG. 4).

Each of FIGS. 3-7 illustrates embodiments where NMOS transistors are used to implement various transistors of the bias circuit 210, the linearization circuit 220, and the coupling circuit 230. In other embodiments of the bias arrangements shown in FIGS. 3-7, one or more of the NMOS transistors of any of the bias arrangements 300, 400, 500, 600, and 700 may be replaced with N-type bipolar transistors, i.e., with NPN transistors. For such embodiments, descriptions provided above are still applicable, except that for such bipolar transistors, the "first terminals" described above are the base terminals (i.e., the terminals that were the gate terminals for the FETs described above), the "second terminals" are the collector terminals (i.e., the terminals that were the drain terminals for the FETs described above), and the "third terminals" are the emitter terminals (i.e., the terminals that were the source terminals for the FETs described above). Thus, in various embodiments of the bias arrangement 200, transistors used in the bias circuit 210, the linearization circuit 220, and the coupling circuit 230 may be NMOS transistors, NPN transistors, or a combination of NMOS and NPN transistors.

Furthermore, while each of FIGS. 3-7 illustrates and the description above indicates that the bias arrangement 200 may include various transistors of the N-type of transistors (e.g., NMOS or NPN transistors), in further embodiments, any of these transistors may be implemented as P-type transistors (e.g., PMOS or PNP transistors). For such embodiments, descriptions provided above are still applicable, except that for the P-type transistors, the supply voltage Vs described above for the N-type transistors is to be replaced with the ground potential Vgnd, and vice versa.

Example RF Devices and Systems

Bias arrangements with linearization transistors sensing RF signals and providing bias signals at different terminals as described herein may be included in various RF devices and systems used in wireless or cable communications. For illustration purposes only, one example RF device that may include one or more bias arrangements with linearization transistors sensing RF signals and providing bias signals at different terminals, according to some embodiments of the present disclosure, is shown in FIG. 8 and described below.

Figure 8:
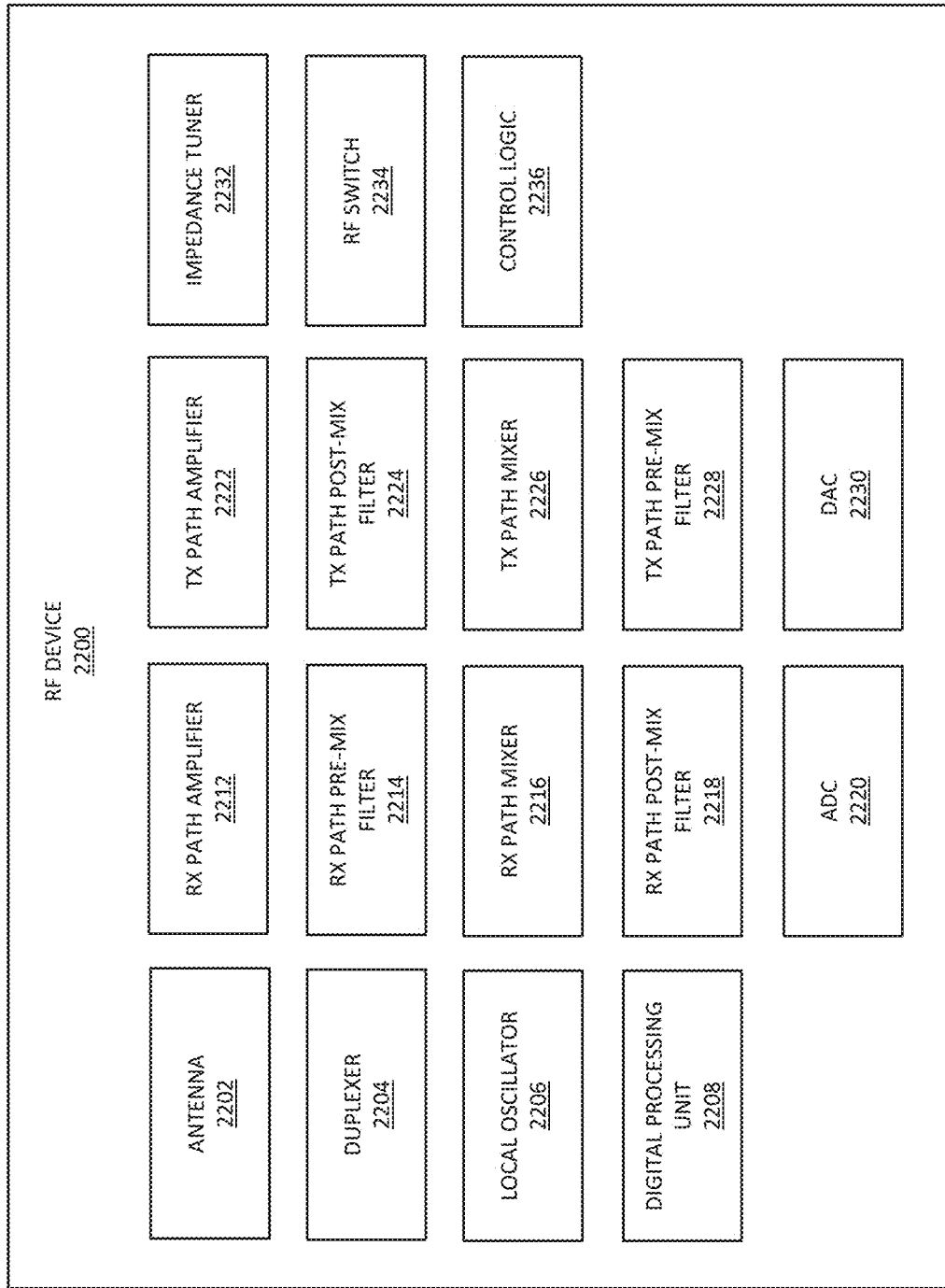
FIG. 8 provides a block diagram illustrating an antenna apparatus with amplifiers that may be biased by bias arrangements with linearization transistors sensing RF signals and providing bias signals at different terminals, according to some embodiments of the present disclosure.

FIG. 8 is a block diagram of an example RF device 2200, e.g., an RF transceiver, that may include one or more bias arrangements with linearization transistors sensing RF signals and providing bias signals at different terminals, according to some embodiments of the present disclosure.

In general, the RF device 2200 may be any device or system that may support wireless transmission and/or reception of signals in the form of electromagnetic waves in the RF range of approximately 3 kilohertz (kHz) to approximately 300 Gigahertz (GHz). In some embodiments, the RF device 2200 may be used for wireless communications, e.g., in a base station (BS) or a user equipment (UE) device of any suitable cellular wireless communications technology, such as GSM, WCDMA, or LTE. In a further example, the RF device 2200 may be used as, or in, e.g., a BS or a UE device of a millimeter-wave wireless technology such as fifth generation (5G) wireless (i.e., high-frequency/short wavelength spectrum, e.g., with frequencies in the range between about 20 and 60 GHz, corresponding to wavelengths in the range between about 5 and 15 millimeters). In yet another example, the RF device 2200 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2200 may be used for wireless communications using Bluetooth technology (e.g., a frequency band from about 2.4 to about 2.485 GHz, corresponding to a wavelength of about 12 cm). In other embodiments, the RF device 2200 may be used for transmitting and/or receiving RF signals for purposes other than communication, e.g., in an automotive radar system, or in medical applications such as magneto-resonance imaging (MRI).

In various embodiments, the RF device 2200 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 8 as included in the RF device 2200, but any one or more of these components may be omitted or duplicated, as suitable for the application. For example, in some embodiments, the RF device 2200 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2200 may be an RF device supporting only wireless reception (e.g., an RF receiver), in which case it may include the components of the RX path, but not the components of the TX path; or the RF device 2200 may be an RF device supporting only wireless transmission (e.g., an RF transmitter), in which case it may include the components of the TX path, but not the components of the RX path.

In some embodiments, some or all the components included in the RF device 2200 may be attached to one or more motherboards. In some embodiments, some or all these components are fabricated on a single die, e.g., on a single system on chip (SOC) die.

Additionally, in various embodiments, the RF device 2200 may not include one or more of the components illustrated in FIG. 8, but the RF device 2200 may include interface circuitry for coupling to the one or more components. For example, the RF device 2200 may not include an antenna 2202, but may include antenna interface circuitry (e.g., a matching circuitry, a connector and driver circuitry) to which an antenna 2202 may be coupled. In another set of examples, the RF device 2200 may not include a digital processing unit 2208 or a local oscillator 2206, but may include device interface circuitry (e.g., connectors and supporting circuitry) to which a digital processing unit 2208 or a local oscillator 2206 may be coupled.

As shown in FIG. 8, the RF device 2200 may include an antenna 2202, a duplexer 2204 (e.g., if the RF device 2200 is an FDD RF device; otherwise the duplexer 2204 may be omitted), a local oscillator 2206, a digital processing unit 2208. As also shown in FIG. 8, the RF device 2200 may include an RX path that may include an RX path amplifier 2212, an RX path pre-mix filter 2214, a RX path mixer 2216, an RX path post-mix filter 2218, and an analog-to-digital converter (ADC) 2220. As further shown in FIG. 8, the RF device 2200 may include a TX path that may include a TX path amplifier 2222, a TX path post-mix filter 2224, a TX path mixer 2226, a TX path pre-mix filter 2228, and a digital-to-analog converter (DAC) 2230. Still further, the RF device 2200 may further include an impedance tuner 2232, an RF switch 2234, and control logic 2236. In various embodiments, the RF device 2200 may include multiple instances of any of the components shown in FIG. 8. In some embodiments, the RX path amplifier 2212, the TX path amplifier 2222, the duplexer 2204, and the RF switch 2234 may be considered to form, or be a part of, an RF front-end (FE) of the RF device 2200. In some embodiments, the RX path amplifier 2212, the TX path amplifier 2222, the duplexer 2204, and the RF switch 2234 may be considered to form, or be a part of, an RF FE of the RF device 2200. In some embodiments, the RX path mixer 2216 and the TX path mixer 2226 (possibly with their associated pre-mix and post-mix filters shown in FIG. 8) may be considered to form, or be a part of, an RF transceiver of the RF device 2200 (or of an RF receiver or an RF transmitter if only RX path or TX path components, respectively, are included in the RF device 2200). In some embodiments, the RF device 2200 may further include one or more control logic elements/circuits, shown in FIG. 8 as control logic 2236, e.g., an RF FE control interface. In some embodiments, the control logic 2236 may be configured to control at least portions of operating any of the bias arrangements with linearization transistors sensing RF signals and providing bias signals at different terminals, as described herein, e.g., the bias arrangements configured to provide bias signals for the TX path amplifier 2222 of the RF device 2200. In some embodiments, the control logic 2236 may be used to perform control other functions within the RF device 2200, e.g., enhance control of complex RF system environment, support implementation of envelope tracking techniques, reduce dissipated power, etc.

The antenna 2202 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2200 is an FDD transceiver, the antenna 2202 may be configured for concurrent reception and transmission of communication signals in separate, i.e., non-overlapping and non-continuous, bands of frequencies, e.g., in bands having a separation of, e.g., 20 MHz from one another. If the RF device 2200 is a TDD transceiver, the antenna 2202 may be configured for sequential reception and transmission of communication signals in bands of frequencies that may be the same or overlapping for TX and RX paths. In some embodiments, the RF device 2200 may be a multi-band RF device, in which case the antenna 2202 may be configured for concurrent reception of signals having multiple RF components in separate frequency bands and/or configured for concurrent transmission of signals having multiple RF components in separate frequency bands. In such embodiments, the antenna 2202 may be a single wide-band antenna or a plurality of band-specific antennas (i.e., a plurality of antennas each configured to receive and/or transmit signals in a specific band of frequencies). In various embodiments, the antenna 2202 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2200 may include more than one antenna 2202 to implement antenna diversity. In some such embodiments, the RF switch 2234 may be deployed to switch between different antennas.

An output of the antenna 2202 may be coupled to the input of the duplexer 2204. The duplexer 2204 may be any suitable component configured for filtering multiple signals to allow for bidirectional communication over a single path between the duplexer 2204 and the antenna 2202. The duplexer 2204 may be configured for providing RX signals to the RX path of the RF device 2200 and for receiving TX signals from the TX path of the RF device 2200.

The RF device 2200 may include one or more local oscillators 2206, configured to provide local oscillator signals that may be used for downconversion of the RF signals received by the antenna 2202 and/or upconversion of the signals to be transmitted by the antenna 2202.

The RF device 2200 may include the digital processing unit 2208, which may include one or more processing devices. The digital processing unit 2208 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 8, in some embodiments, the RF device 2200 may further include a memory device, configured to cooperate with the digital processing unit 2208.

Turning to the details of the RX path that may be included in the RF device 2200, the RX path amplifier 2212 may include a low-noise amplifier (LNA). An input of the RX path amplifier 2212 may be coupled to an antenna port (not shown) of the antenna 2202, e.g., via the duplexer 2204. The RX path amplifier 2212 may amplify the RF signals received by the antenna 2202.

An output of the RX path amplifier 2212 may be coupled to an input of the RX path pre-mix filter 2214, which may be a harmonic or band-pass (e.g., low-pass) filter, configured to filter received RF signals that have been amplified by the RX path amplifier 2212.

An output of the RX path pre-mix filter 2214 may be coupled to an input of the RX path mixer 2216, also referred to as a downconverter. The RX path mixer 2216 may include two inputs and one output. A first input may be configured to receive the RX signals, which may be current signals, indicative of the signals received by the antenna 2202 (e.g., the first input may receive the output of the RX path pre-mix filter 2214). A second input may be configured to receive local oscillator signals from one of the local oscillators 2206. The RX path mixer 2216 may then mix the signals received at its two inputs to generate a downconverted RX signal, provided at an output of the RX path mixer 2216. As used herein, downconversion refers to a process of mixing a received RF signal with a local oscillator signal to generate a signal of a lower frequency. In particular, the TX path mixer (e.g., downconverter) 2216 may be configured to generate the sum and/or the difference frequency at the output port when two input frequencies are provided at the two input ports. In some embodiments, the RF device 2200 may implement a direct-conversion receiver (DCR), also known as homodyne, synchrodyne, or zero-IF receiver, in which case the RX path mixer 2216 may be configured to demodulate the incoming radio signals using local oscillator signals whose frequency is identical to, or very close to the carrier frequency of the radio signal. In other embodiments, the RF device 2200 may make use of downconversion to an intermediate frequency (IF). IFs may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2216 may include several such stages of IF conversion.

Although a single RX path mixer 2216 is shown in the RX path of FIG. 8, in some embodiments, the RX path mixer 2216 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2202 and an in-phase component of the local oscillator signal provided by the local oscillator 2206. The second RX path mixer may be configured for performing downconversion to generate a quadrature (Q) downconverted RX signal by mixing the RX signal received by the antenna 2202 and a quadrature component of the local oscillator signal provided by the local oscillator 2206 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2216 may, optionally, be coupled to the RX path post-mix filter 2218, which may be low-pass filters. In case the RX path mixer 2216 is a quadrature mixer that implements the first and second mixers as described above, the in-phase and quadrature components provided at the outputs of the first and second mixers respectively may be coupled to respective individual first and second RX path post-mix filters included in the filter 2218.

The ADC 2220 may be configured to convert the mixed RX signals from the RX path mixer 2216 from analog to digital domain. The ADC 2220 may be a quadrature ADC that, like the RX path quadrature mixer 2216, may include two ADCs, configured to digitize the downconverted RX path signals separated in in-phase and quadrature components. The output of the ADC 2220 may be provided to the digital processing unit 2208, configured to perform various functions related to digital processing of the RX signals so that information encoded in the RX signals can be extracted.

Turning to the details of the TX path that may be included in the RF device 2200, the digital signal to later be transmitted (TX signal) by the antenna 2202 may be provided, from the digital processing unit 2208, to the DAC 2230. Like the ADC 2220, the DAC 2230 may include two DACs, configured to convert, respectively, digital I- and Q-path TX signal components to analog form.

Optionally, the output of the DAC 2230 may be coupled to the TX path pre-mix filter 2228, which may be a bandpass (e.g., low-pass) filter (or a pair of band-pass, e.g., low-pass, filters, in case of quadrature processing) configured to filter out, from the analog TX signals output by the DAC 2230, the signal components outside of the desired band. The digital TX signals may then be provided to the TX path mixer 2226, which may also be referred to as an upconverter. Like the RX path mixer 2216, the TX path mixer 2226 may include a pair of TX path mixers, for in-phase and quadrature component mixing. Like the first and second RX path mixers that may be included in the RX path, each of the TX path mixers of the TX path mixer 2226 may include two inputs and one output. A first input may receive the TX signal components, converted to the analog form by the respective DAC 2230, which are to be upconverted to generate RF signals to be transmitted. The first TX path mixer may generate an in-phase (I) upconverted signal by mixing the TX signal component converted to analog form by the DAC 2230 with the in-phase component of the TX path local oscillator signal provided from the local oscillator 2206 (in various embodiments, the local oscillator 2206 may include a plurality of different local oscillators, or be configured to provide different local oscillator frequencies for the mixer 2216 in the RX path and the mixer 2226 in the TX path). The second TX path mixer may generate a quadrature phase (Q) upconverted signal by mixing the TX signal component converted to analog form by the DAC 2230 with the quadrature component of the TX path local oscillator signal. The output of the second TX path mixer may be added to the output of the first TX path mixer to create a real RF signal. A second input of each of the TX path mixers may be coupled the local oscillator 2206.

Optionally, the RF device 2200 may include the TX path post-mix filter 2224, configured to filter the output of the TX path mixer 2226.

The TX path amplifier 2222 may include any embodiments of the bias arrangements with linearization transistors sensing RF signals and providing bias signals at different terminals as described herein.

In various embodiments, any of the RX path pre-mix filter 2214, the RX path post-mix filter 2218, the TX post-mix filter 2224, and the TX pre-mix filter 2228 may be implemented as RF filters. In some embodiments, an RF filter may be implemented as a plurality of RF filters, or a filter bank. A filter bank may include a plurality of RF filters that may be coupled to a switch, e. g., the RF switch 2234, configured to selectively switch any one of the plurality of RF filters on and off (e.g., activate any one of the plurality of RF filters), in order to achieve desired filtering characteristics of the filter bank (i.e., in order to program the filter bank). For example, such a filter bank may be used to switch between different RF frequency ranges when the RF device 2200 is, or is included in, a BS or in a UE device. In another example, such a filter bank may be programmable to suppress TX leakage on the different duplex distances.

The impedance tuner 2232 may include any suitable circuitry, configured to match the input and output impedances of the different RF circuitries to minimize signal losses in the RF device 2200. For example, the impedance tuner 2232 may include an antenna impedance tuner. Being able to tune the impedance of the antenna 2202 may be particularly advantageous because antenna's impedance is a function of the environment that the RF device 2200 is in, e.g., antenna's impedance changes depending on, e.g., if the antenna is held in a hand, placed on a car roof, etc.

As described above, the RF switch 2234 may be a device configured to route high-frequency signals through transmission paths, e.g., in order to selectively switch between a plurality of instances of any one of the components shown in FIG. 8, e.g., to achieve desired behavior and characteristics of the RF device 2200. For example, in some embodiments, an RF switch may be used to switch between different antennas 2202. In other embodiments, an RF switch may be used to switch between a plurality of RF filters (e.g., by selectively switching RF filters on and off) of the RF device 2200. Typically, an RF system would include a plurality of such RF switches.

The RF device 2200 provides a simplified version and, in further embodiments, other components not specifically shown in FIG. 8 may be included. For example, the RX path of the RF device 2200 may include a current-to-voltage amplifier between the RX path mixer 2216 and the ADC 2220, which may be configured to amplify and convert the downconverted signals to voltage signals. In another example, the RX path of the RF device 2200 may include a balun transformer for generating balanced signals. In yet another example, the RF device 2200 may further include a clock generator, which may, e.g., include a suitable phased-lock loop (PLL), configured to receive a reference clock signal and use it to generate a different clock signal that may then be used for timing the operation of the ADC 2220, the DAC 2230, and/or that may also be used by the local oscillator 2206 to generate the local oscillator signals to be used in the RX path or the TX path.

Example Data Processing System

Figure 9:
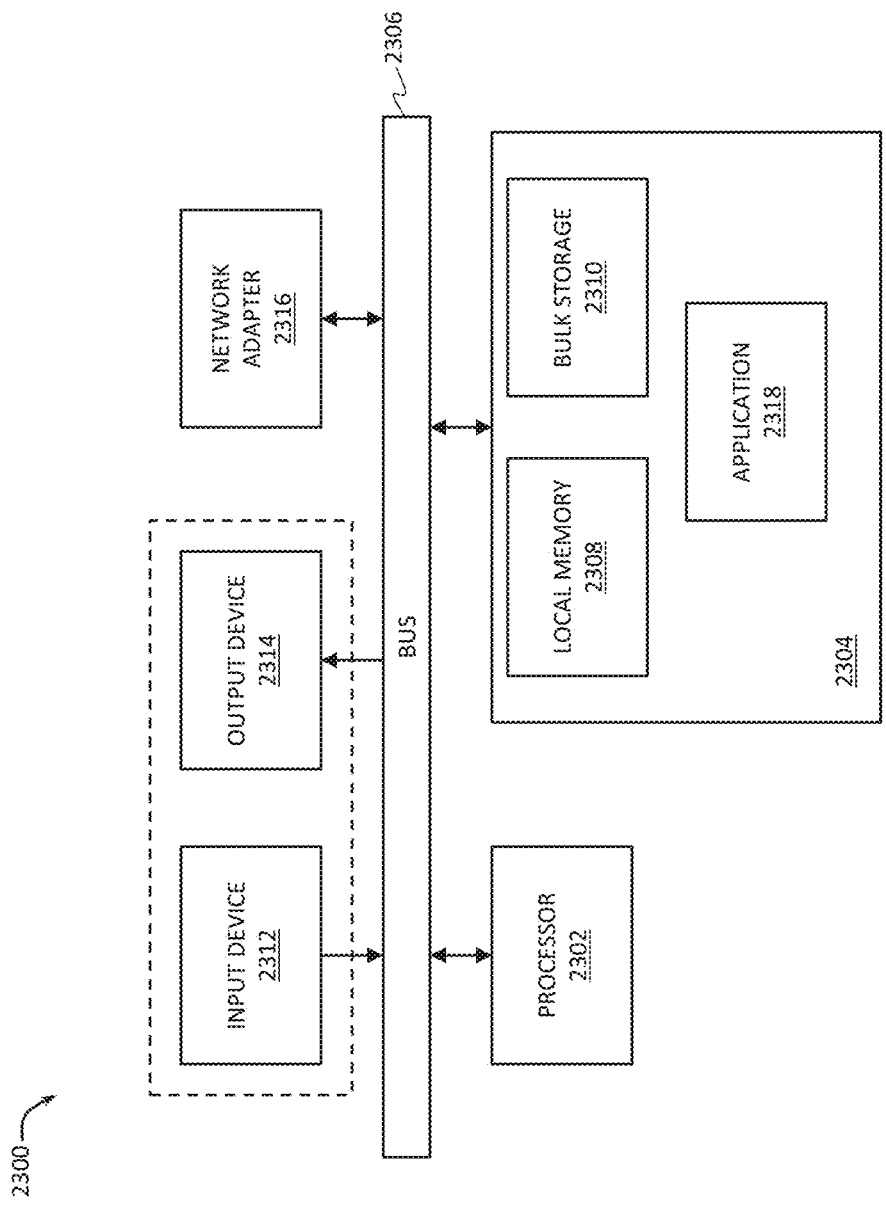
FIG. 9 provides a block diagram illustrating an example data processing system that may be configured to implement, or control, at least portions of operation of an amplifier biased by a bias arrangement with one or more linearization transistors sensing RF signals and providing bias signals at different terminals, according to some embodiments of the present disclosure.

FIG. 9 provides a block diagram illustrating an example data processing system 2300 that may be configured to control operation of one or more bias arrangements with linearization transistors sensing RF signals and providing bias signals at different terminals as described herein, according to some embodiments of the present disclosure. For example, the data processing system 2300 may be configured to implement or control portions of the bias arrangements as shown in FIGS. 3-7, or any further embodiments of the bias arrangements with linearization transistors sensing RF signals and providing bias signals at different terminals as described herein. In another example, the data processing system 2300 may be configured to implement at least portions of the control logic 2236, shown in FIG. 8.

As shown in FIG. 9, the data processing system 2300 may include at least one processor 2302, e.g. a hardware processor 2302, coupled to memory elements 2304 through a system bus 2306. As such, the data processing system may store program code within memory elements 2304. Further, the processor 2302 may execute the program code accessed from the memory elements 2304 via a system bus 2306. In one aspect, the data processing system may be implemented as a computer that is suitable for storing and/or executing program code. It should be appreciated, however, that the data processing system 2300 may be implemented in the form of any system including a processor and a memory that is capable of performing the functions described within this disclosure.

In some embodiments, the processor 2302 can execute software or an algorithm to perform the activities as discussed in the present disclosure, in particular activities related to operating bias arrangements with linearization transistors sensing RF signals and providing bias signals at different terminals as described herein. The processor 2302 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 2302 may be communicatively coupled to the memory element 2304, for example in a direct-memory access (DMA) configuration, so that the processor 2302 may read from or write to the memory elements 2304.

In general, the memory elements 2304 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 2300 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements illustrating bias arrangements with linearization transistors sensing RF signals and providing bias signals at different terminals as shown in FIGS. 2-9, can also include suitable interfaces for receiving, transmitting, and/or otherwise communicating data or information in a network environment so that they can communicate with, e.g., the data processing system 2300.

In certain example implementations, mechanisms for implementing or operating bias arrangements with linearization transistors sensing RF signals and providing bias signals at different terminals as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 2304 shown in FIG. 9, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 2302 shown in FIG. 9, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 2304 may include one or more physical memory devices such as, for example, local memory 2308 and one or more bulk storage devices 2310. The local memory may refer to RAM or other non-persistent memory device(s) generally used during actual execution of the program code. A bulk storage device may be implemented as a hard drive or other persistent data storage device. The processing system 2300 may also include one or more cache memories (not shown) that provide temporary storage of at least some program code in order to reduce the number of times program code must be retrieved from the bulk storage device 2310 during execution.

As shown in FIG. 9, the memory elements 2304 may store an application 2318. In various embodiments, the application 2318 may be stored in the local memory 2308, the one or more bulk storage devices 2310, or apart from the local memory and the bulk storage devices. It should be appreciated that the data processing system 2300 may further execute an operating system (not shown in FIG. 9) that can facilitate execution of the application 2318. The application 2318, being implemented in the form of executable program code, can be executed by the data processing system 2300, e.g., by the processor 2302. Responsive to executing the application, the data processing system 2300 may be configured to perform one or more operations or method steps described herein.

Input/output (I/O) devices depicted as an input device 2312 and an output device 2314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 2314 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 2314. Input and/or output devices 2312, 2314 may be coupled to the data processing system either directly or through intervening I/O controllers.

In an embodiment, the input and the output devices may be implemented as a combined input/output device (illustrated in FIG. 9 with a dashed line surrounding the input device 2312 and the output device 2314). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 2316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 2300, and a data transmitter for transmitting data from the data processing system 2300 to said systems, devices and/or networks. Modems, cable modems, and Ethernet cards are examples of different types of network adapter that may be used with the data processing system 2300.

SELECT EXAMPLES

The following paragraphs provide various examples of the embodiments disclosed herein.

Example 1 provides a bias arrangement for an amplifier, where the amplifier may be one of a power amplifier (e.g., a Doherty amplifier, a class A amplifier, a class B amplifier, a class AB amplifier, or a class C amplifier), a linear amplifier, an LNA, or a variable gain amplifier. The bias arrangement includes a linearization circuit, configured to generate a modified bias signal based on an RF signal indicative of an RF input signal to be amplified by the power amplifier, the linearization circuit including a bias signal input for receiving a bias signal (e.g., a DC signal), an RF signal input for receiving the RF signal, one or more linearization transistors, each having a first terminal (e.g., a gate terminal for transistors implemented as FETs or a base terminal for transistors implemented as BJTs), a second terminal (e.g., a drain terminal for transistors implemented as FETs or a collector terminal for transistors implemented as BJTs), and a third terminal (e.g., a source terminal for transistors implemented as FETs or an emitter terminal for transistors implemented as BJTs), and an output for providing the modified bias signal. Each of the bias signal input and the RF signal input of the linearization circuit is coupled to the first terminal of a first linearization transistor of the one or more linearization transistors, and the output of the linearization circuit is coupled to the third terminal of the first linearization transistor.

Example 2 provides the bias arrangement according to example 1, where the linearization circuit further includes an RF signal coupling component (e.g., a coupling capacitor) having a first terminal and a second terminal, and the RF signal input of the linearization circuit is coupled to the first terminal of the first linearization transistor by the RF signal input of the linearization circuit being coupled the first terminal of the RF signal coupling component, and the second terminal of the RF signal coupling component being coupled to the first terminal of the first linearization transistor.

Example 3 provides the bias arrangement according to example 2, where the RF signal coupling component is a capacitor, the first terminal of the RF signal coupling component is a first capacitor electrode of the capacitor, and the second terminal of the RF signal coupling component is a second capacitor electrode of the capacitor.

Example 4 provides the bias arrangement according to any one of the preceding claims, where the linearization circuit further includes a bias signal coupling component (e.g., a coupling resistor) having a first terminal and a second terminal, and the bias signal input of the linearization circuit is coupled to the first terminal of the first linearization transistor by the bias signal input of the linearization circuit being coupled the first terminal of the bias signal coupling component, and the second terminal of the bias signal coupling component being coupled to the first terminal of the first linearization transistor.

Example 5 provides the bias arrangement according to example 4, where the bias signal coupling component is a resistor.

Example 6 provides the bias arrangement according to any one of the preceding claims, where the second terminal of the first linearization transistor is coupled to a supply voltage if each of the one or more linearization transistors is an N-type transistor, and the second terminal of the first linearization transistor is coupled to a ground voltage if each of the one or more linearization transistors is a P-type transistor.

Example 7 provides the bias arrangement according to any one of the preceding claims, where the one or more linearization transistors further include a cascode linearization transistor, the second terminal of the first linearization transistor is coupled to the third terminal of the cascode linearization transistor.

Example 8 provides the bias arrangement according to example 7, where the second terminal of the cascode linearization transistor is coupled to a supply voltage if each of the one or more linearization transistors is an N-type transistor, and the second terminal of the cascode linearization transistor is coupled to a ground voltage if each of the one or more linearization transistors is a P-type transistor.

Example 9 provides the bias arrangement according to claim 7 or 8, where the first terminal of the cascode linearization transistor is coupled to a voltage source.

Example 10 provides the bias arrangement according to any one of the preceding claims, where the RF input signal is a differential signal that includes a first differential portion and a second differential portion, the RF signal is a first differential RF signal indicative of the first differential portion of the RF input signal, the RF signal input is a first RF signal input, the linearization circuit further includes a second RF signal input for receiving a second differential RF signal indicative of a second differential portion of the RF input signal, the one or more linearization transistors further include a second linearization transistor, each of the bias signal input and the second RF signal input of the linearization circuit is coupled to the first terminal of the second linearization transistor, and the output of the linearization circuit is further coupled to the third terminal of the second linearization transistor.

Example 11 provides the bias arrangement according to example 10, where the linearization circuit further includes a second RF signal coupling component (e.g., a coupling capacitor) having a first terminal and a second terminal, and the second RF signal input of the linearization circuit is coupled to the first terminal of the second linearization transistor by the second RF signal input of the linearization circuit being coupled the first terminal of the second RF signal coupling component, and the second terminal of the second RF signal coupling component being coupled to the first terminal of the second linearization transistor.

Example 12 provides the bias arrangement according to example 11, where the second RF signal coupling component is a capacitor, the first terminal of the second RF signal coupling component is a first capacitor electrode of the capacitor, and the third terminal of the second RF signal coupling component is a second capacitor electrode of the capacitor.

Example 13 provides the bias arrangement according to any one of claims 10-12, where the one or more linearization transistors further include a first cascode linearization transistor and a second cascode linearization transistor, the second terminal of the first linearization transistor is coupled to the third terminal of the first cascode linearization transistor, the second terminal of the second linearization transistor is coupled to the third terminal of the second cascode linearization transistor, and the first terminal of the first cascode linearization transistor is coupled to the first terminal of the second cascode linearization transistor.

Example 14 provides the bias arrangement according to any one of claims 10-13, where the second RF signal input of the linearization circuit is further coupled to the third terminal of the first linearization transistor, and the first RF signal input of the linearization circuit is further coupled to the third terminal of the second linearization transistor.

Example 15 provides the bias arrangement according to any one of the preceding claims, where the linearization circuit further includes a first degeneration component (e.g., a first degeneration resistor) and a second degeneration component (e.g., a second degeneration resistor), each having a first terminal and a second terminal, the output of the linearization circuit is coupled to the third terminal of the first linearization transistor by the first terminal of the first degeneration component being coupled to the output of the linearization circuit, and the second terminal of the first degeneration component being coupled to the third terminal of the first linearization transistor, and the output of the linearization circuit is further coupled to the third terminal of the second linearization transistor by the first terminal of the second degeneration component being coupled to the output of the linearization circuit, and the second terminal of the second degeneration component being coupled to the third terminal of the second linearization transistor.

Example 16 provides the bias arrangement according to example 15, where the second RF signal input of the linearization circuit is further coupled to the third terminal of the first linearization transistor by the second RF signal input of the linearization circuit being coupled to the second terminal of the first degeneration component, and the first RF signal input of the linearization circuit is further coupled to the third terminal of the second linearization transistor by the first RF signal input of the linearization circuit being coupled to the second terminal of the second degeneration component.

Example 17 provides a bias arrangement for a power amplifier. The bias arrangement includes a linearization circuit, configured to generate a modified bias signal based on an RF input signal to be amplified by the power amplifier, the linearization circuit including one or more linearization transistors, each having a first terminal (e.g., a gate terminal for transistors implemented as FETs or a base terminal for transistors implemented as BJTs), a second terminal (e.g., a drain terminal for transistors implemented as FETs or a collector terminal for transistors implemented as BJTs), and a third terminal (e.g., a source terminal for transistors implemented as FETs or an emitter terminal for transistors implemented as BJTs), and an RF signal input for receiving an RF signal indicative of the RF input signal to be amplified by the power amplifier. The bias arrangement further includes an output for outputting the modified bias signal generated based on the RF signal, where the RF signal input and the output of the linearization circuit are coupled to different terminals of a first linearization transistor of the one or more linearization transistors.

Example 18 provides the bias arrangement according to example 17, where the bias arrangement further includes a bias circuit, the bias circuit having an output configured to output a bias signal for the power amplifier, the bias arrangement further includes a coupling circuit, the coupling circuit having an input coupled to the output of the bias circuit and having an output coupled to an input of the bias circuit, the linearization circuit further includes a bias signal input for receiving a signal indicative of the bias signal output by the bias circuit, the bias signal input of the linearization circuit is coupled to the output of the coupling circuit, and the RF signal input and the bias signal input of the linearization circuit are coupled to a single (i.e., the same) terminal of the first linearization transistor.

Example 19 provides a bias arrangement for a power amplifier, the bias arrangement including a linearization circuit, configured to generate a modified bias signal based on an RF input signal to be amplified by the power amplifier, the RF input signal being a differential signal that includes a first differential portion and a second differential portion. The linearization circuit includes a plurality of linearization transistors, each having a first terminal (e.g., a gate terminal for transistors implemented as FETs or a base terminal for transistors implemented as BJTs), a second terminal (e.g., a drain terminal for transistors implemented as FETs or a collector terminal for transistors implemented as BJTs), and a third terminal (e.g., a source terminal for transistors implemented as FETs or an emitter terminal for transistors implemented as BJTs). Each of the linearization transistors also includes a first RF signal input for receiving a first differential RF signal indicative of the first differential portion of the RF input signal, a second RF signal input for receiving a second differential RF signal indicative of the second differential portion of the RF input signal, and an output for outputting the modified bias signal generated based on the RF input signal. The plurality of linearization transistors includes a first linearization transistor and a second linearization transistor, where the first RF signal input is coupled to the first terminal of the first linearization transistor and the third terminal of the second linearization transistor, the second RF signal input is coupled to the first terminal of the second linearization transistor and the third terminal of the first linearization transistor, and the output is coupled to the third terminal of the first linearization transistor and the third terminal of the second linearization transistor.

Example 20 provides the bias arrangement according to example 19, where the first RF signal input is coupled to the first terminal of the first linearization transistor via a first coupling component (e.g., a capacitor 364-1), the second RF signal input is coupled to the third terminal of the first linearization transistor via a second coupling component (e.g., a capacitor 764-1), the first RF signal input is coupled to the third terminal of the second linearization transistor via a first further coupling component (e.g., a capacitor 764-2), and the second RF signal input is coupled to the first terminal of the second linearization transistor via a second further coupling component (e.g., a capacitor 364-2).

Example 21 provides an RF system, the RF system including an amplifier, configured to receive an input signal and generate an output signal based on the input signal; and a bias arrangement, configured to provide a bias signal for the amplifier, where the bias arrangement is a bias arrangement according to any one of the preceding examples.

Example 22 provides the RF system according to example 21, further including an antenna element, the antenna element configured to wirelessly transmit an RF signal based on the output signal generated by the amplifier.

Example 23 provides the RF system according to examples 21 or 22, further including a beamforming element, the beamforming element configured to receive a first signal and generate a second signal that is phase-shifted with respect to the first signal, where the input signal to the amplifier is based on the second signal generated by the beamforming element.

Example 24 provides the RF system according to any one of examples 21-23, where the amplifier is one of a power amplifier (e.g., a Doherty amplifier, a class A amplifier, a class B amplifier, a class AB amplifier, or a class C amplifier), a linear amplifier, an LNA, or a variable gain amplifier.

Example 25 provides the RF system according to any one of examples 21-24, where the RF system is a mobile device (e.g., a UE of a wireless cellular network).

Example 26 provides the RF system according to any one of examples 21-24, where the RF system is a BS of a wireless cellular network or a transmitter of a cable communications network.

Variations and Implementations

While embodiments of the present disclosure were described above with references to exemplary implementations as shown in FIGS. 2-9, a person skilled in the art will realize that the various teachings described above are applicable to a large variety of other implementations. For example, descriptions provided herein are applicable not only to 5G systems, which provide one example of wireless communication systems, but also to other wireless communication systems such as, but not limited to, Wi-Fi technology or Bluetooth technology. In yet another example, descriptions provided herein are applicable not only to wireless communication systems, but also to any other systems where amplifiers may be used, such as radar systems, automotive radar, and cable communication systems (e.g., cable television systems, etc.).

In certain contexts, the features discussed herein can be applicable to automotive systems, medical systems, scientific instrumentation, wireless and wired communications, radio, radar, and digital-processing-based systems.

In the discussions of the embodiments above, components of a system, such as phase shifters, frequency mixers, transistors, resistors, capacitors, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to bias arrangements with linearization transistors sensing RF signals and providing bias signals at different terminals as described herein.

Parts of various systems for implementing bias arrangements with linearization transistors sensing RF signals and providing bias signals at different terminals, as proposed herein, can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that particular embodiments of the present disclosure may be readily included in a SOC package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components shown in the systems of FIGS. 2-9) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present drawings may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to realizing bias arrangements with linearization transistors sensing RF signals and providing bias signals at different terminals as proposed herein illustrate only some of the possible functions that may be executed by, or within, RF systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

The invention claimed is:

1. An electronic component, comprising:
   a linearization circuit to generate a modified bias signal based on a radio frequency (RF) input signal to be amplified by a power amplifier, wherein the RF input signal is a differential signal that includes a first differential portion and a second differential portion, and wherein the linearization circuit includes:
   a bias signal input for receiving a bias signal,
   a first RF signal input for receiving a first RF indicative of the first differential portion of the RF input signal,
   a second RF signal input for receiving a second RF signal indicative of the second differential portion of the RF input signal,
   linearization transistors, each having a first terminal, a second terminal, and a third terminal, and
   an output for providing the modified bias signal,
   wherein:
   each of the bias signal input and the first RF signal input is coupled to the first terminal of a first linearization transistor of the linearization transistors,
   each of the bias signal input and the second RF signal input is coupled to the first terminal of a second linearization transistor of the linearization transistors, and
   the output is coupled to the third terminal of the first linearization transistor and the third terminal of the second linearization transistor.

2. The electronic component according to claim 1, wherein:
   the linearization circuit further includes an RF signal coupling component having a first terminal and a second terminal, and
   the first RF signal input is coupled to the first terminal of the first linearization transistor by the first RF signal input being coupled the first terminal of the RF signal coupling component, and the second terminal of the RF signal coupling component being coupled to the first terminal of the first linearization transistor.

3. The electronic component according to claim 2, wherein the RF signal coupling component is a capacitor, the first terminal of the RF signal coupling component is a first capacitor electrode of the capacitor, and the second terminal of the RF signal coupling component is a second capacitor electrode of the capacitor.

4. The electronic component according to claim 1, wherein:
   the linearization circuit further includes a bias signal coupling component having a first terminal and a second terminal, and
   the bias signal input is coupled to the first terminal of the first linearization transistor by the bias signal input being coupled the first terminal of the bias signal coupling component, and the second terminal of the bias signal coupling component being coupled to the first terminal of the first linearization transistor.

5. The electronic component according to claim 4, wherein the bias signal coupling component is a resistor.

6. The electronic component according to claim 1, wherein:
   the second terminal of the first linearization transistor is to be coupled to a supply when the first linearization transistor is an N-type transistor, and the second terminal of the first linearization transistor is to be coupled to a ground voltage when the first linearization transistor is a P-type transistor.

7. The electronic component according to claim 1, wherein:
the linearization transistors further include a cascode linearization transistor, and
the second terminal of the first linearization transistor is coupled to the third terminal of the cascode linearization transistor.

8. The electronic component according to claim 7, wherein:
the second terminal of the cascode linearization transistor is to be coupled to a supply voltage when the cascode linearization transistor is an N-type transistor, and
the second terminal of the cascode linearization transistor is to be coupled to a ground voltage when the cascode linearization transistor is a P-type transistor.

9. The electronic component according to claim 7, wherein the first terminal of the cascode linearization transistor is to be coupled to a voltage source.

10. The electronic component according to claim 1, wherein:
the linearization circuit further includes a second RF signal coupling component having a first terminal and a second terminal, and
the second RF signal input is coupled to the first terminal of the second linearization transistor by the second RF signal input being coupled the first terminal of the second RF signal coupling component, and the second terminal of the second RF signal coupling component being coupled to the first terminal of the second linearization transistor.

11. The electronic component according to claim 10, wherein the second RF signal coupling component is a capacitor, the first terminal of the second RF signal coupling component is a first capacitor electrode of the capacitor, and the third terminal of the second RF signal coupling component is a second capacitor electrode of the capacitor.

12. The electronic component according to claim 10, wherein:
the linearization transistors further include a first cascode linearization transistor and a second cascode linearization transistor,
the second terminal of the first linearization transistor is coupled to the third terminal of the first cascode linearization transistor,
the second terminal of the second linearization transistor is coupled to the third terminal of the second cascode linearization transistor, and
the first terminal of the first cascode linearization transistor is coupled to the first terminal of the second cascode linearization transistor.

13. The electronic component according to claim 1, wherein:
the second RF signal input is further coupled to the third terminal of the first linearization transistor, and
the first RF signal input is further coupled to the third terminal of the second linearization transistor.

14. The electronic component according to claim 13, wherein:
the linearization circuit further includes a first degeneration component and a second degeneration component, each having a first terminal and a second terminal,
the output is coupled to the third terminal of the first linearization transistor by the first terminal of the first degeneration component being coupled to the output, and the second terminal of the first degeneration component being coupled to the third terminal of the first linearization transistor, and
the output is further coupled to the third terminal of the second linearization transistor by the first terminal of the second degeneration component being coupled to the output, and the second terminal of the second degeneration component being coupled to the third terminal of the second linearization transistor.

15. The electronic component according to claim 14, wherein:
the second RF signal input is further coupled to the third terminal of the first linearization transistor by the second RF signal input being coupled to the second terminal of the first degeneration component, and
the first RF signal input is further coupled to the third terminal of the second linearization transistor by the first RF signal input being coupled to the second terminal of the second degeneration component.

16. The electronic component according to claim 1, further comprising the power amplifier.

17. The electronic component according to claim 1, wherein the electronic component is an RF transceiver.

18. An electronic component, comprising:
a linearization circuit to generate a modified bias signal based on a bias signal and further based on a radio frequency (RF) input signal to be amplified by power amplifier, the linearization circuit including:
a bias signal input for receiving the bias signal,
a linearization transistor,
an RF signal input for receiving an RF signal indicative of the RF input signal to be amplified by the power amplifier, and
an output for providing the modified bias signal,
wherein:
a first terminal of the linearization transistor is coupled to each of the bias signal input and the RF signal input,
a second terminal of the linearization transistor is to be coupled to a supply voltage when the linearization transistor is an N-type transistor and is to be coupled to a ground voltage when the linearization transistor is a P-type transistor,
a third terminal of the linearization transistor is coupled to the output.

19. The electronic component according to claim 18, wherein the linearization circuit further includes a bias signal coupling component, coupled between the bias signal input and the first terminal of the linearization transistor.

20. The electronic component according to claim 19, wherein the first terminal of the linearization transistor is coupled to the bias signal input by the bias signal input being coupled a first terminal of the bias signal coupling component and by a second terminal of the bias signal coupling component being coupled to the first terminal of the linearization transistor.

21. The electronic component according to claim 19, wherein the bias signal coupling component is a resistor.

22. The electronic component according to claim 18, wherein:
wherein the linearization transistor is a bipolar transistor, the first terminal of the linearization transistor is a base terminal, the second terminal of the linearization transistor is a collector terminal, and the third terminal of the linearization transistor is an emitter terminal, and
wherein the linearization transistor is a field-effect transistor, the first terminal of the linearization transistor is a gate terminal, the second terminal of the linearization transistor is a drain terminal, and the third terminal of the linearization transistor is a source terminal.

23. The electronic component according to claim 18, further comprising the power amplifier.

24. The electronic component according to claim 18, further comprising an antenna element to wirelessly transmit an RF signal based on an output signal generated by the power amplifier based on the RF input signal.

25. The electronic component according to claim 18, further comprising a beamforming element to receive a first signal and generate a second signal that is phase-shifted with respect to the first signal, wherein the RF input signal to be amplified by the power amplifier is based on the second signal generated by the beamforming element.

26. The electronic component according to claim 18, wherein the electronic component is an RF transceiver.

27. An electronic component, comprising:
a linearization circuit, to generate a modified bias signal based on a radio frequency (RF) input signal to be amplified by a power amplifier, the RF input signal being a differential signal that includes a first differential portion and a second differential portion, and the linearization circuit including:
a plurality of linearization transistors, each having a first RF terminal, a second terminal, and a third terminal,
a first RF signal input for receiving a first RF signal indicative of the first differential portion of the RF input signal,
a second RF signal input for receiving a second RF signal indicative of the second differential portion of the RF input signal, and
an output for outputting the modified bias signal generated based on the RF input signal,
wherein:
the plurality of linearization transistors includes a first linearization transistor and a second linearization transistor,
the first RF signal input is coupled to the first terminal of the first linearization transistor and the third terminal of the second linearization transistor,
the second RF signal input is coupled to the first terminal of the second linearization transistor and the third terminal of the first linearization transistor, and
the output is coupled to the third terminal of the first linearization transistor and the third terminal of the second linearization transistor.

28. The electronic component according to claim 27, wherein:
the first RF signal input is coupled to the first terminal of the first linearization transistor via a first coupling component,
the second RF signal input is coupled to the third terminal of the first linearization transistor via a second coupling component,
the first RF signal input is coupled to the third terminal of the second linearization transistor via a first further coupling component, and
the second RF signal input is coupled to the first terminal of the second linearization transistor via a second further coupling component.

29. The electronic component according to claim 27, wherein:
when an individual linearization transistor of the plurality of linearization transistors is a bipolar transistor, the first terminal of the individual linearization transistor is a base terminal, the second terminal of the individual linearization transistor is a collector terminal, and the third terminal of the individual linearization transistor is an emitter terminal, and
when the individual linearization transistor of the plurality of linearization transistors is a field-effect transistor, the first terminal of the individual linearization transistor is a gate terminal, the second terminal of the individual linearization transistor is a drain terminal, and the third terminal of the individual linearization transistor is a source terminal.

30. The electronic component according to claim 27, further comprising the power amplifier.

31. The electronic component according to claim 27, further comprising an antenna element to wireless transmit an RF signal based on an output signal generated by the power amplifier based on the RF input signal.

32. The electronic component according to claim 27, further comprising a beamforming element to receive a first signal and generate a second signal that is phase-shifted with respect to the first signal, where the RF input signal to be amplified by the power amplifier is based on the second signal generated by the beamforming element.

33. The electronic component according to claim 27, wherein the electronic component is an RF transceiver.

* * * * *